United States Patent [19]

Bulucea

[11] Patent Number: 6,020,227

[45] Date of Patent: Feb. 1, 2000

[54] FABRICATION OF MULTIPLE FIELD-EFFECT TRANSISTOR STRUCTURE HAVING LOCAL THRESHOLD-ADJUST DOPING

[75] Inventor: Constantin Bulucea, Milpitas, Calif.

[73] Assignee: National Semiconductor Corporation, Santa Clara, Calif.

[21] Appl. No.: 08/812,509

[22] Filed: Mar. 7, 1997

Related U.S. Application Data

[62] Division of application No. 08/527,399, Sep. 12, 1995, abandoned.

[51] Int. Cl.[7] .................................................. H01L 21/337
[52] U.S. Cl. ........................ 438/194; 438/217; 438/275; 438/276; 438/286; 438/291
[58] Field of Search ..................................... 438/194, 217, 438/286, 276, 275

[56] References Cited

U.S. PATENT DOCUMENTS

| | | |
|---|---|---|
| H986 | 11/1991 | Codella et al. . |
| 4,280,855 | 7/1981 | Bertin et al. . |
| 4,282,648 | 8/1981 | Yu et al. . |
| 4,442,589 | 4/1984 | Doo et al. . |
| 4,929,991 | 5/1990 | Blanchard . |
| 5,072,267 | 12/1991 | Hattori . |
| 5,155,563 | 10/1992 | Davies et al. . |
| 5,216,272 | 6/1993 | Kubokoya et al. . |
| 5,237,193 | 8/1993 | Williams et al. . |
| 5,296,393 | 3/1994 | Smayling et al. . |
| 5,306,656 | 4/1994 | Williams et al. . |
| 5,364,807 | 11/1994 | Hwang . |
| 5,371,394 | 12/1994 | Ma et al. . |
| 5,401,987 | 3/1995 | Hiser et al. ............................. 257/204 |
| 5,427,964 | 6/1995 | Kaneshiro et al. . |
| 5,441,906 | 8/1995 | Burger . |
| 5,451,807 | 9/1995 | Fujita . |
| 5,472,897 | 12/1995 | Hsu et al. . |
| 5,482,878 | 1/1996 | Burger et al. . |
| 5,486,487 | 1/1996 | Ginami et al. . |
| 5,517,049 | 5/1996 | Huang . |
| 5,565,375 | 10/1996 | Hiser et al. . |
| 5,576,227 | 11/1996 | Hsu . |
| 5,583,067 | 12/1996 | Sanchez . |
| 5,597,752 | 1/1997 | Niwa . |
| 5,605,855 | 2/1997 | Chang et al. . |
| 5,622,880 | 4/1997 | Burr et al. . |
| 5,789,788 | 11/1996 | Ema et al. . |

FOREIGN PATENT DOCUMENTS

| | | |
|---|---|---|
| 0 083 447 | 12/1982 | European Pat. Off. . |
| 0083447 | 7/1983 | European Pat. Off. . |
| 53-66181 | 6/1978 | Japan . |
| 61-276252 | 6/1986 | Japan . |
| 63-275179 | 11/1988 | Japan . |
| WO 90/07794 | 7/1990 | WIPO . |

OTHER PUBLICATIONS

Armijos, "High–Speed DMOS FET Analog Switches and Switch Arrays", *Low–Power Discretes*, Application Note AN301, Siliconix, Jun. 22, 1994, vol. 12, pp. 33–42.

(List continued on next page.)

*Primary Examiner*—Richard Booth
*Assistant Examiner*—Jonathan Hack
*Attorney, Agent, or Firm*—Skjerven, Morrill, MacPherson, Franklin & Friel LLP; Ronald J. Meetin

[57] ABSTRACT

A structure containing multiple field-effect transistors (60 and 150) is fabricated from a semiconductor body having material (82) of a specified conductivity type. Semiconductor dopant of the specified conductivity type is introduced, typically simultaneously, (a) into part of a first channel zone of the material of the specified conductivity type to define a threshold channel portion (66) more heavily doped than a main channel portion (65) and (b) into substantially all of a second channel zone of the material of the specified conductivity type. First and second gate electrodes (69 and 141) are provided respectively above, and insulatingly spaced apart from, the first and second channel zones. Semiconductor dopant of the opposit conductivity type is introduced into the semiconductor body to define (a) a pair of first source/drain zones (63/64 and 75/76) laterally separated by the first channel zone and (b) a pair of second source/drain zones (133/134 and 135/136) laterally separated by the second channel zone.

28 Claims, 18 Drawing Sheets

OTHER PUBLICATIONS

Brews et al., "Generalized Guide for MOSFET Miniaturization", *IEEE Electron Device Letters,* Jan. 1980, pp. 2–4.

Buti et al., "A New Asymmetrical Halo Source GOLD Drain (HS–GOLD) Deep Sub–Half–Micrometer n–MOSFET Design Reliability and Performance", *IEEE Trans. Electron Dev.,* Aug. 1991, pp. 1751–1764.

Chakravarti et al, "Double–Diffused Metal–Oxide Silicon FET," IBM Tech. Discl. Bull., Sep. 1976, pp. 1162–1163.

Chen, *CMOS Devices and Technology for VLSI* (Prentice Hall), Chapter 6, Sec. 6.1, 1990, pp. 174–232.

Cottrell et al., "Hot–Electron Emission in N–channel IGFETs", *IEEE Transactions on Electron Devices,* vol. ED–26, 1979, pp. 520–533.

Declercq et al, "Design and Optimization of High–Voltage CMOS Devices Compatible with Standard 5V CMOS Technology," Proceedings CICC, 1993, pp. 24.6.1–24.6.4.

Declercq et al, "5V–to–75V CMOS Output Interface Circuits", Proceedings ISSC, 1993, pp. 162–163, and ISSC Slide Supplement, pp. 128–129 and 264–266.

Dennard et al, "Design of Ion–Implanted MOSFETs with Very Small Dimensions", *IEEE Journal of Solid State Circuits,* Oct. 1974, pp. 256–266.

Dennard et al, "Design of Micron MOS Switching Devices", *IEDM Technical Digest,* Abstract 24.3, 1972, p. 140.

Dennard et al, "Ion Implanted MOSFETs with Very Short Channel Lengths", *IEDM Technical Digest,* Oct. 1973, pp. 152–155.

El–Kareh et al., *Introduction to VLSI Silicon Devices* (Kluwer Academic), Chapter 6, 1986, pp. 408–557.

Erb et al, "A High Voltage Ion–Implanted MOSFET", *IEDM Technical Digest,* 1971, pp. 158–159.

Fair, "Challenges to Manufacturing Submicron, Ultra–Large Scale Integrated Circuits", *Proceedings of the IEEE,* vol. 78, No. 11, Nov. 1990, pp. 1687–1705.

Hu, "Future CMOS Scaling and Reliability", *Proceedings IEEE,* May 1993, pp. 682–689.

Meyer et al, "Integrable High Voltage CMOS: Devices, Process Application," *IEDM,* 1985, pp. 732–734.

Muller et al., *Device Electronics for Integrated Circuits,* (John Wiley & Sons, 2d Ed.), Chapter 8, 1986, pp. 378–421.

Ogura et al., "Design and Characterization of the Lightly Doped Drain–Source (LDD) Insulator Gate Field–Effect Transistor", *IEEE Transactions on Electron Devices,* vol. ED–27, 1980, pp. 1349–1367.

Ogura et al., "Elimination of Hot Electron Gate Current by the Lightly Doped Drain–Source Structure", *IEDM Technical Digest,* 1981, pp. 651–654.

Oxner, "DMOS Satisfies JFET, CMOS, GaAs FET Performance Needs", *Microwave & RF,* Aug. 1987, pp. 133–136.

Parrillo et al, "Twin–Tub CMOS–A Technology for VLSI Circuits", *IEDM Technical Digest,* 1980, pp. 752–755.

Sanchez et al., "Drain–Engineered Hot–Electron–Resistant Device Structures: A review", *IEEE Transactions on Electron Devices,* vol. 36, 1989, pp. 1125–1132.

Santoni, "Sub–Volt ICs Raise Technology Issues," *Electronic News,* May 22, 1995, pp. 55–56.

Smayling et al, "A Modular Merged Technology Process Including Submicron CMOS Logic, Nonvolatile Memories, Linear Functions, and Power Components", *Proceedings CICC,* 1993, pp. 24.5.1–24.5.4.

Sze, *VLSI Technology* (McGraw–Hill Book Co., 2d Ed.), Section 11.4, 1988, pp. 490–493.

Takeda et al., "AN As–P(n+n–) Double Diffused Drain MOSFET for VLSIs", *IEEE Transactions on Electron Devices,* Jun. 1983, vol. ED–30, pp. 652–657.

Tsang et al., "Fabrication of High–Performance LDDFET's with Oxide Sidwall–Spacer Technology", *IEEE Transactions on Electron Devices,* vol. ED–29, No. 4, Apr. 1982, pp. 590–596.

Tsividis, *Operation and Modeling of the MOS Transistor* (McGraw–Hill Book Co.), Chap. 4, 1987, pp. 102–167.

Warner et al, "BJT–MOSFET Transconductance Comparison", *IEEE Transactions on Electron Devices,* May 1987, pp. 1061–1065.

Williams et al., "D/CMOS Processes for Analogue Multiplexers", *New Electronics,* Jun. 9, 1987, pp. 24–25.

Wolf, S., Silicon Processing for the VLSI Era, vol. 2—Process Integration, pp. 387–389, 1990.

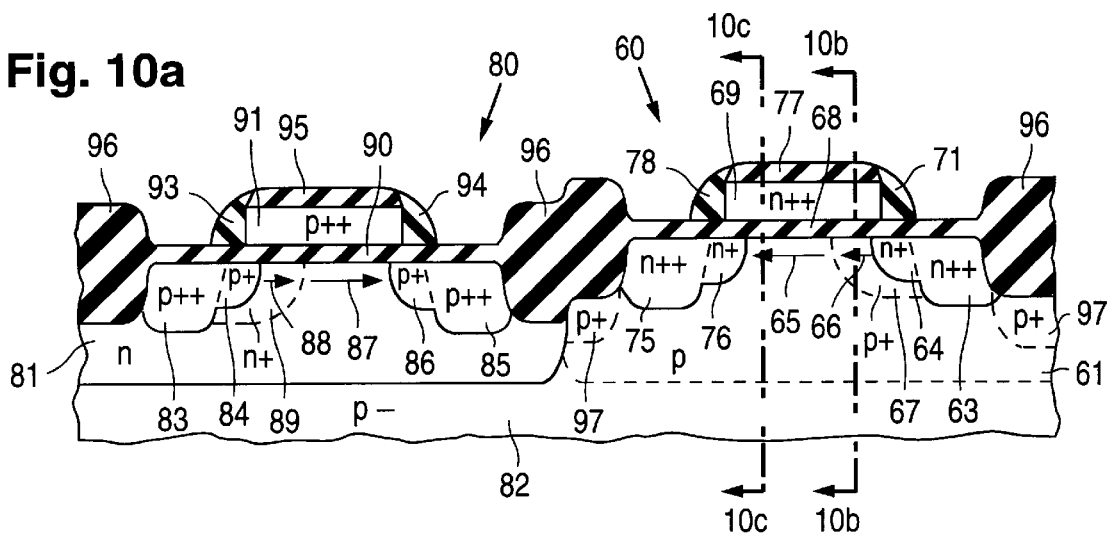
Fig. 10a
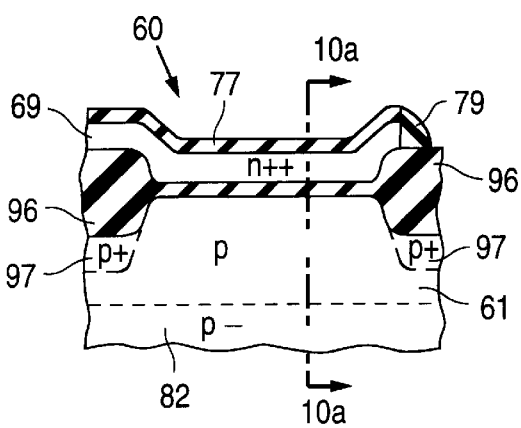
Fig. 10c
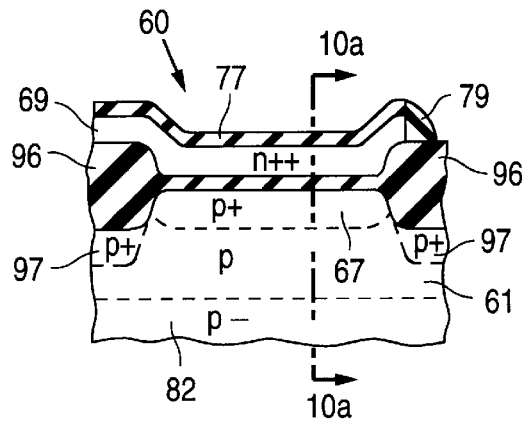
Fig. 10b
Fig. 11

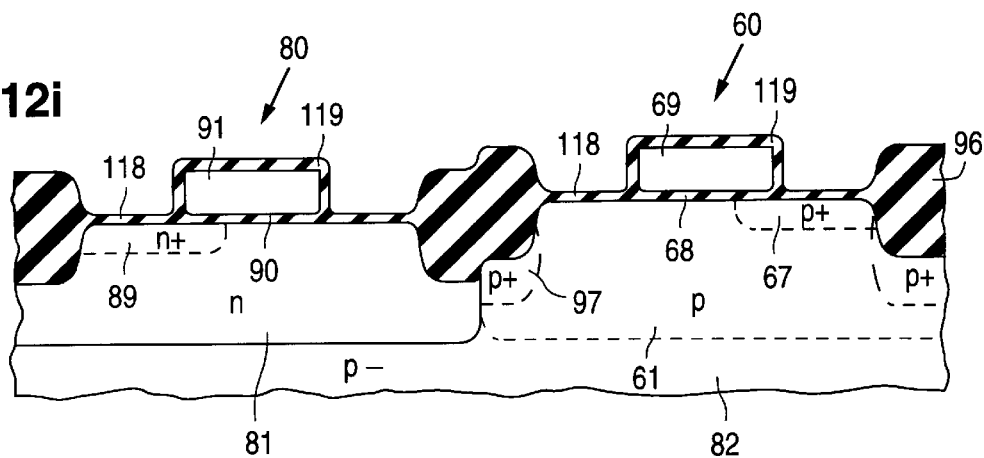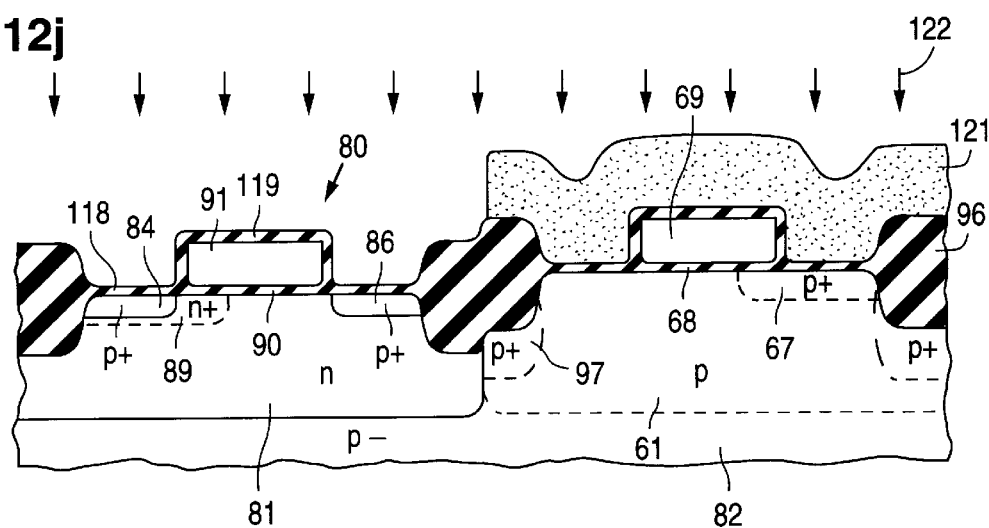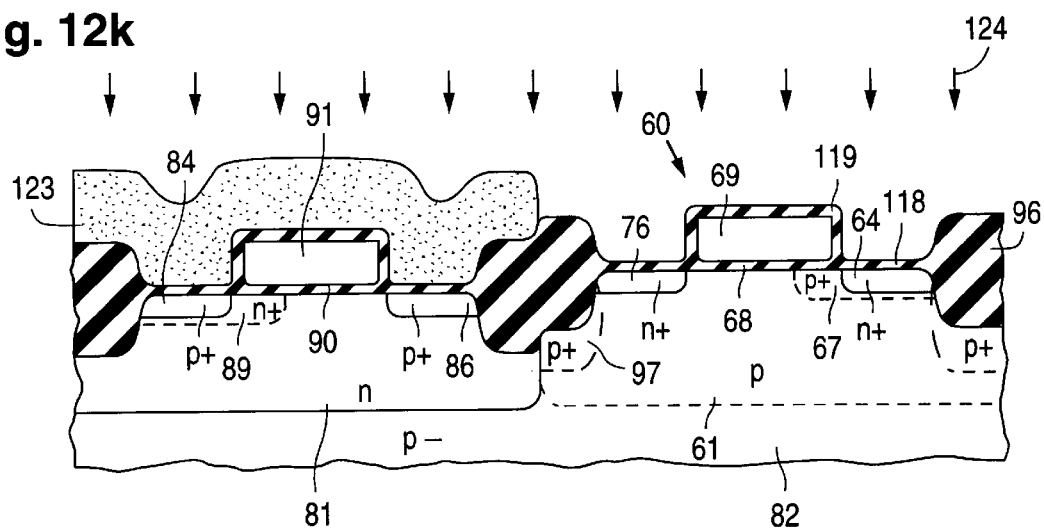

FIG. 15.1
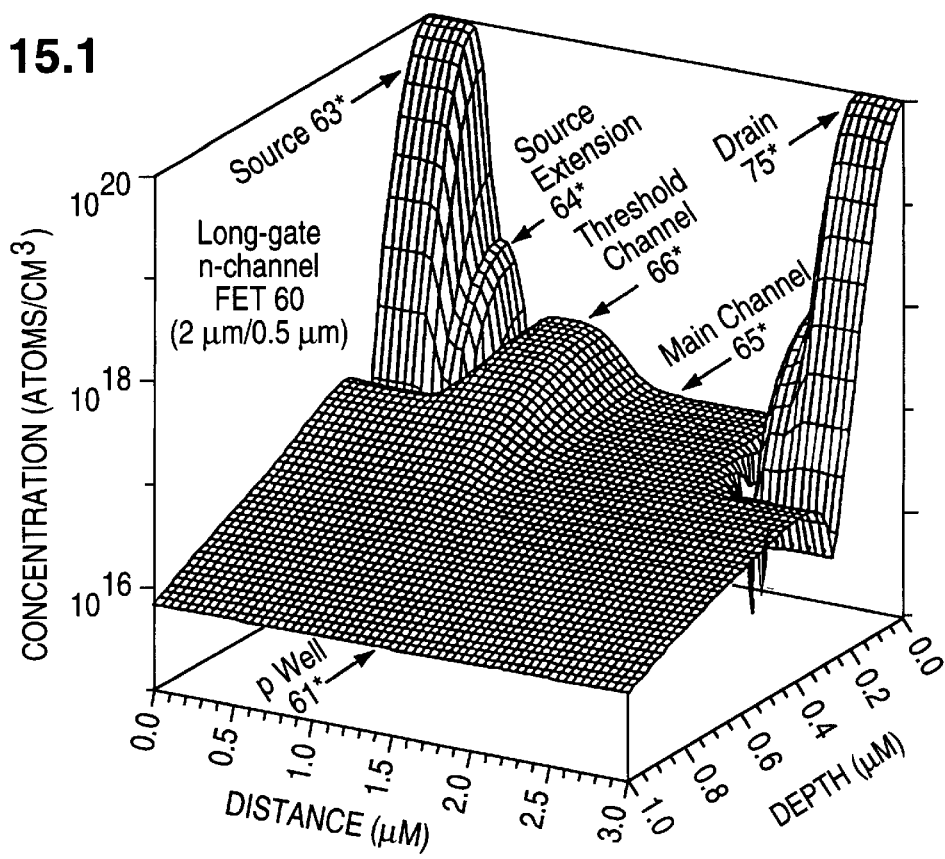
FIG. 15.2
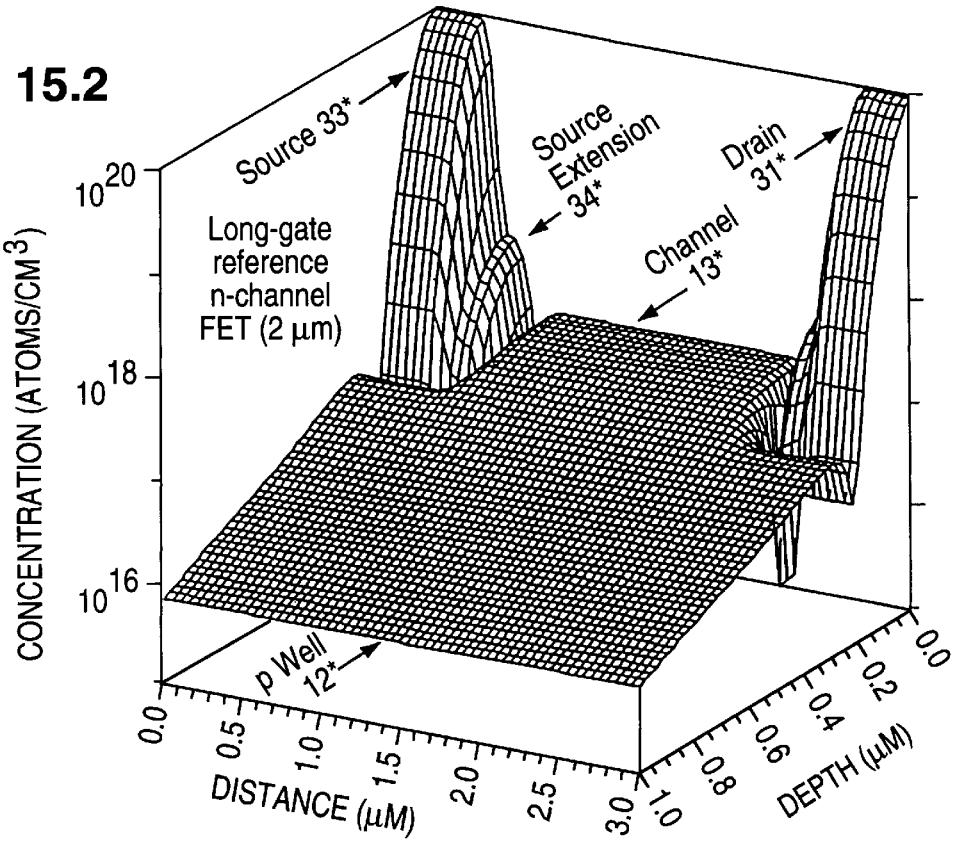

Fig. 16.1
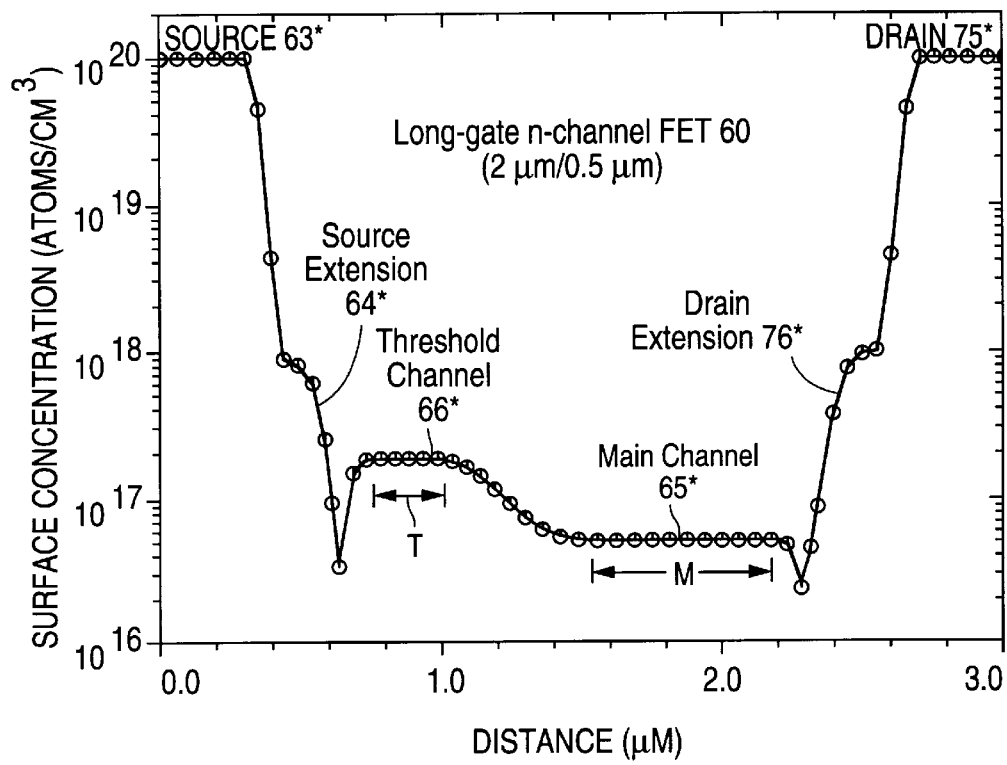
Fig. 16.2
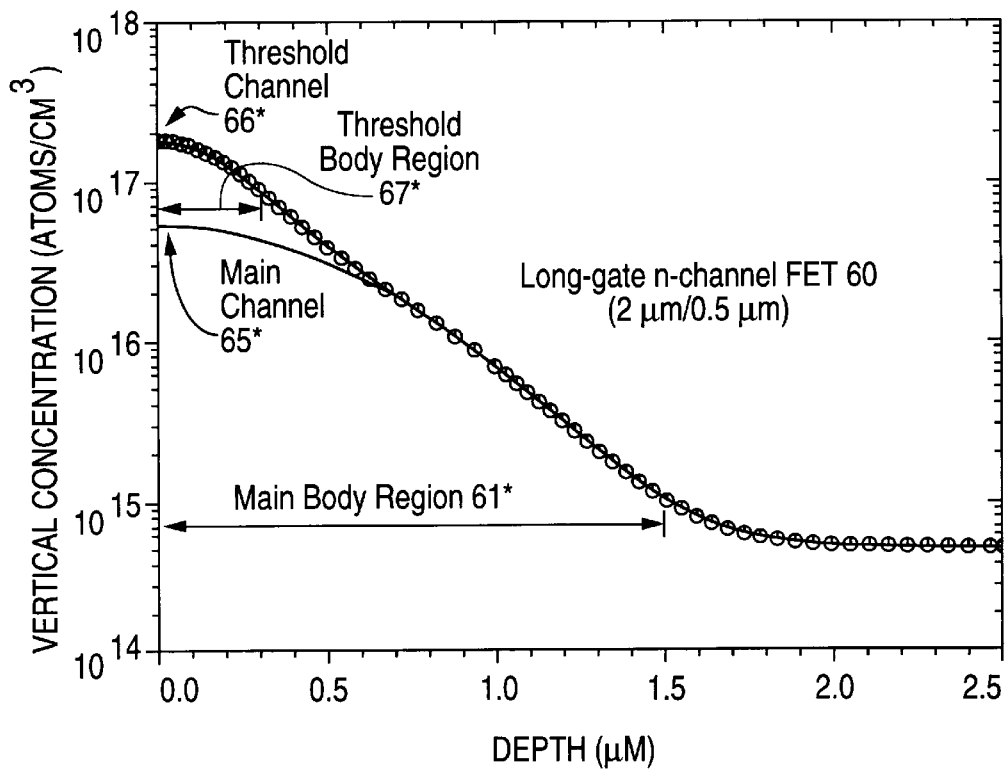

Fig. 17.1
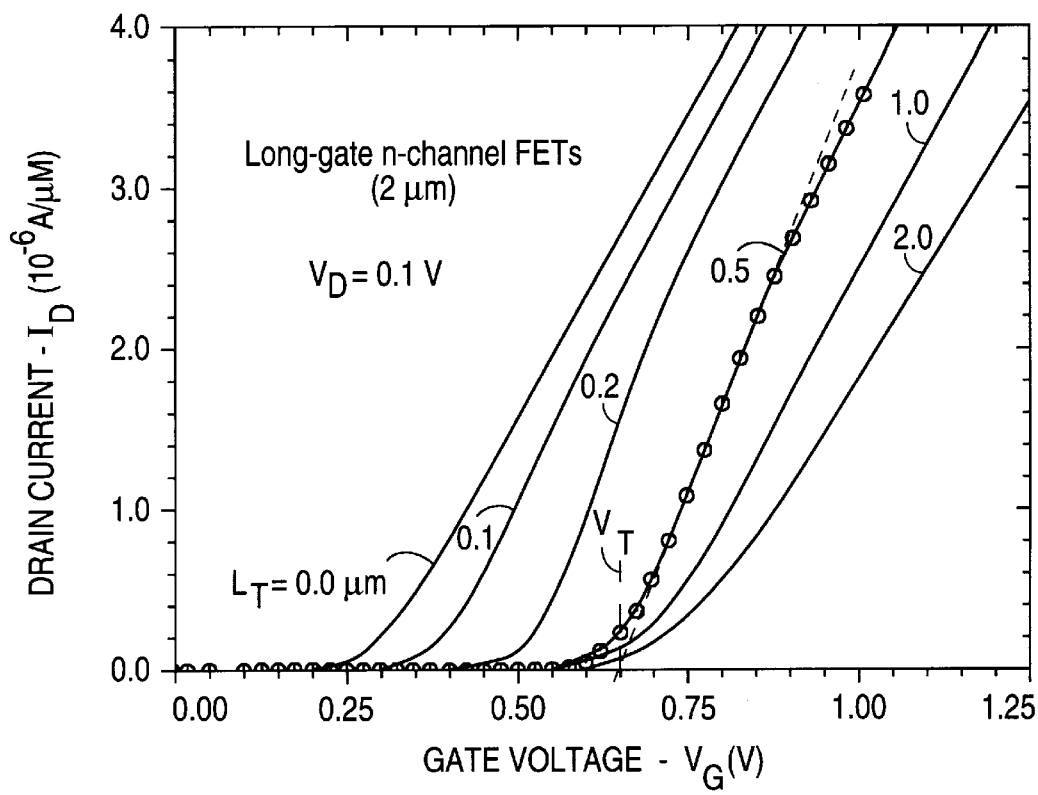
Fig. 17.2
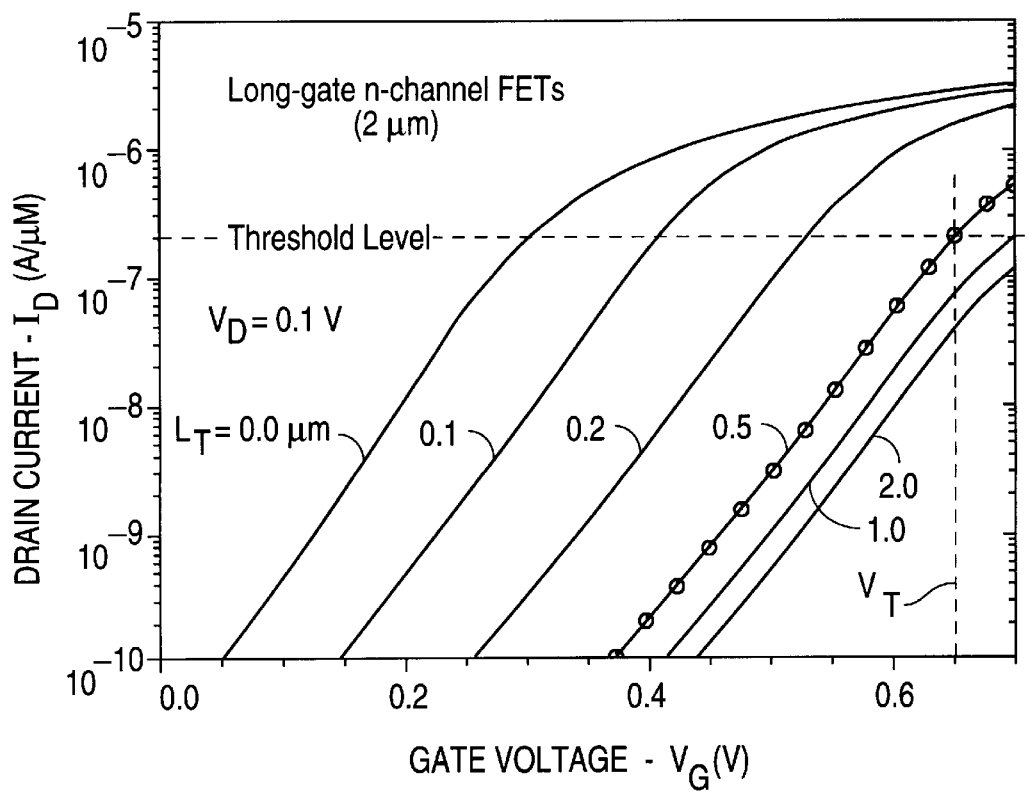

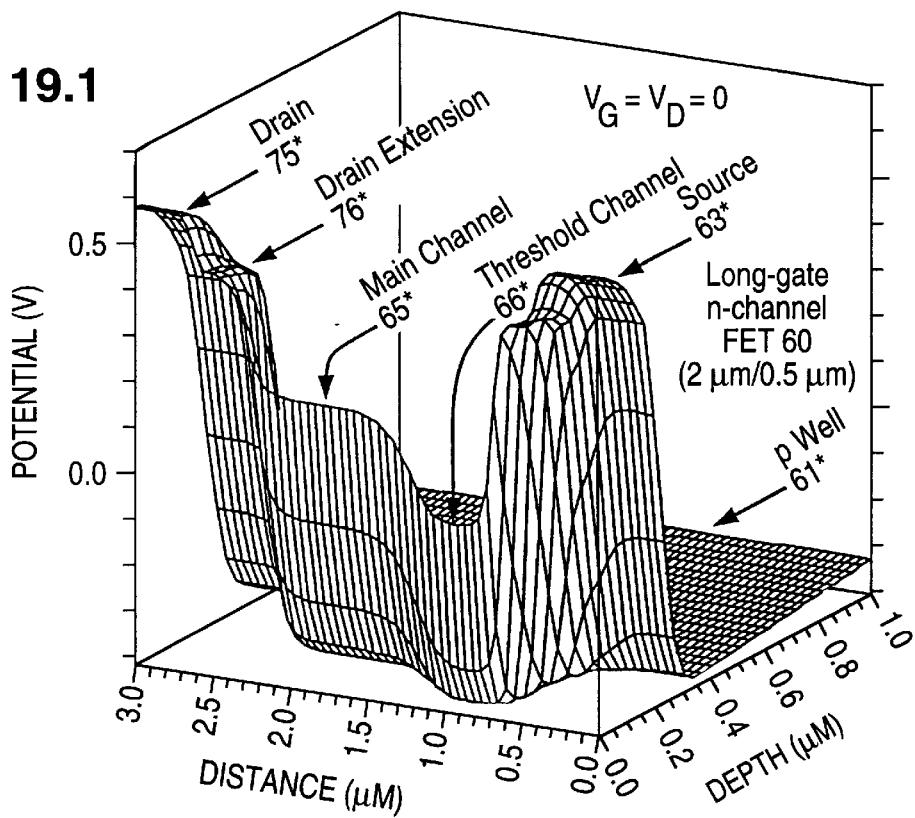
FIG. 19.1
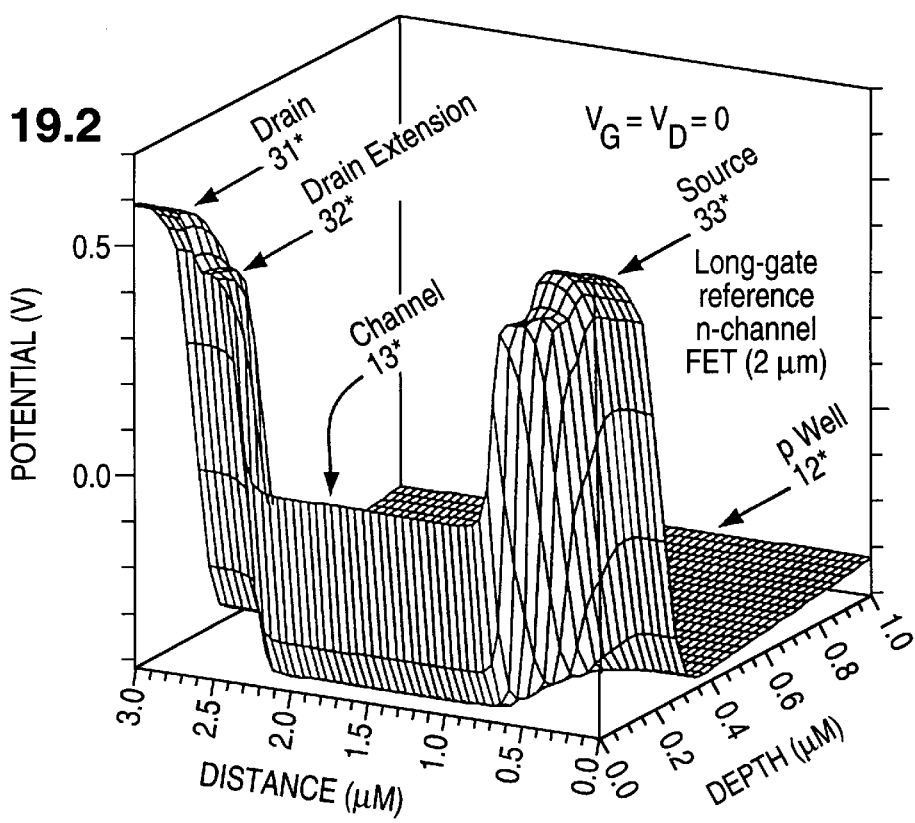
FIG. 19.2

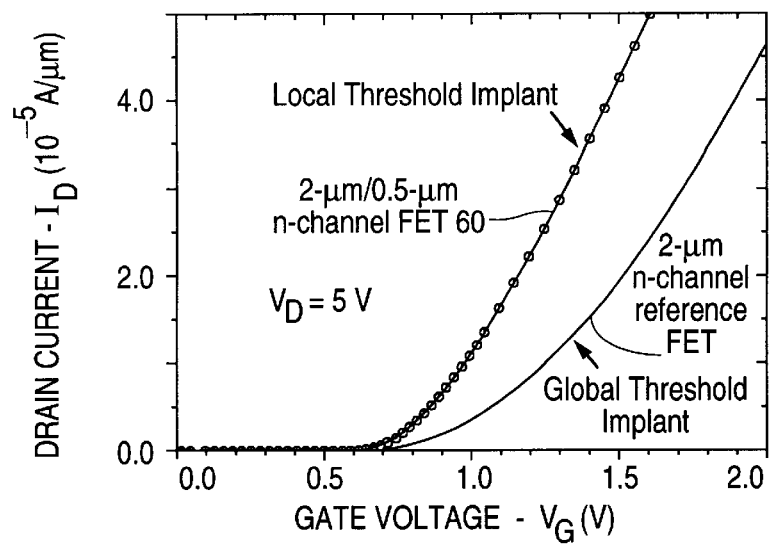
Fig. 20.1
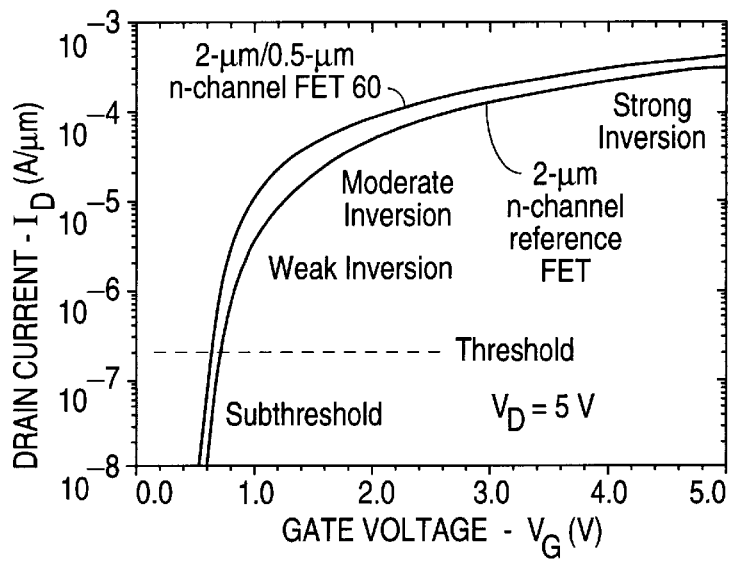
Fig. 20.2
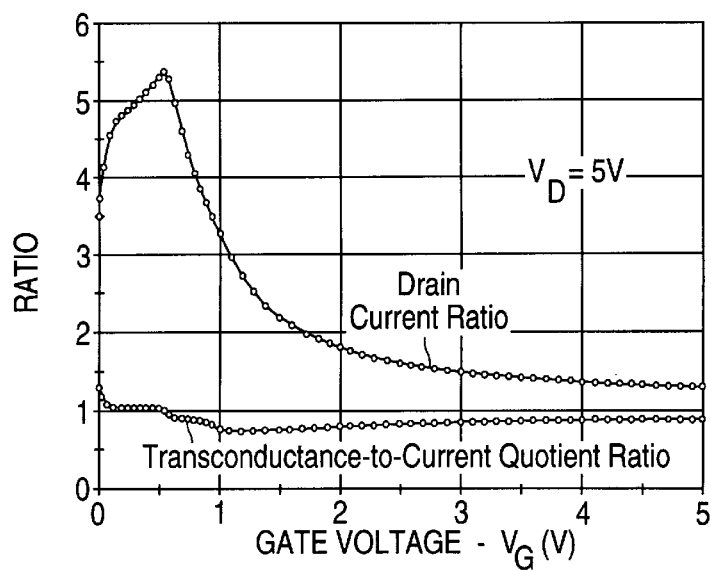
Fig. 21

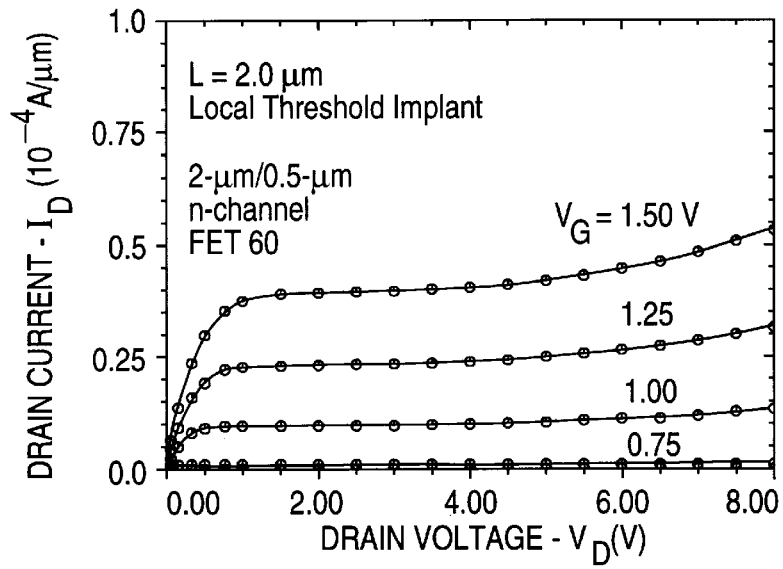
Fig. 22.1
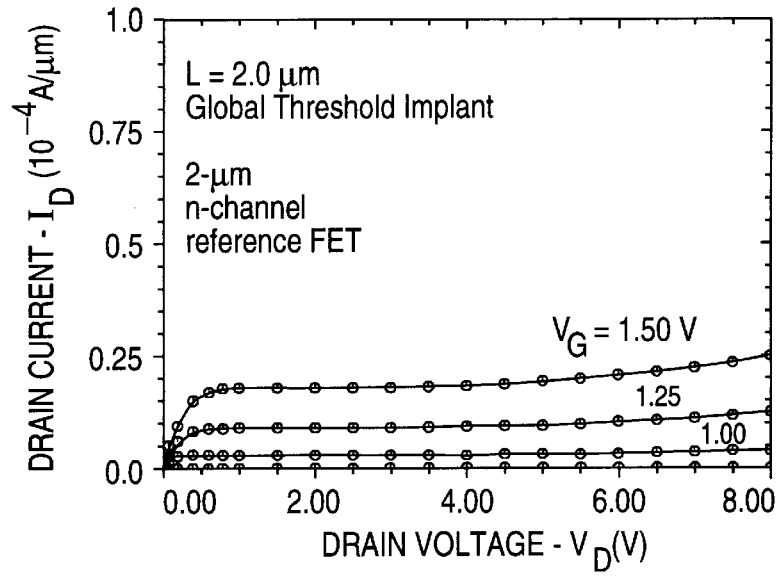
Fig. 22.2
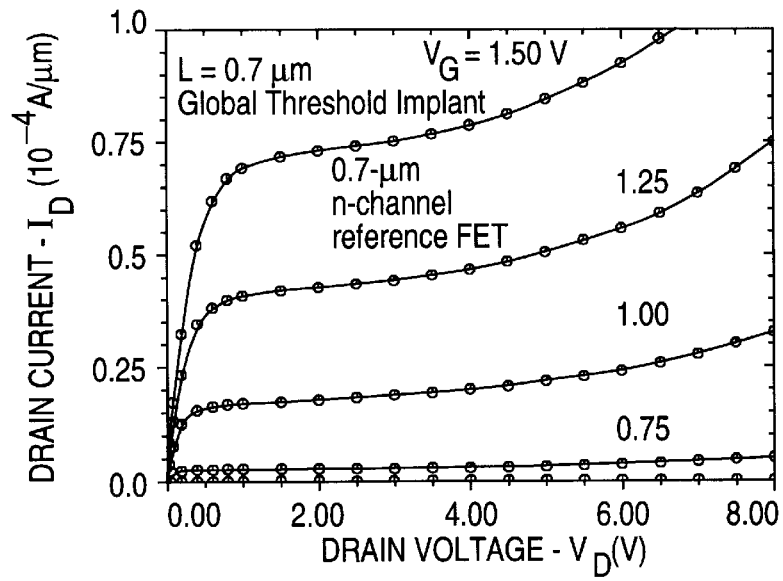
Fig. 22.3

FABRICATION OF MULTIPLE FIELD-EFFECT TRANSISTOR STRUCTURE HAVING LOCAL THRESHOLD-ADJUST DOPING

This is a division of U.S. patent application Ser. No. 08/527,399, filed Sep. 12, 1995 abandoned.

FIELD OF USE

This invention relates to insulated-gate field-effect transistors ("FETs") and, in particular, to insulated-gate FETs having channels longer than the minimum reliably manufacturable size.

BACKGROUND

Very large scale integrated ("VLSI") circuits often contain digital and analog portions. The digital portions may include both low-voltage circuitry where the supply voltage typically is 3.3–5 V and high-voltage circuitry where, as with the analog portions, the supply voltage is greater than 5 V, typically 15 V or more. Field-effect transistors, specifically those of the MOS type, constitute the main active circuit elements currently used in VLSI circuits. The characteristics of FETs in the analog and high-voltage digital portions typically differ from the characteristics of FETs in the low-voltage digital portions.

MOS transistors used in the low-voltage digital circuitry of a VLSI circuit are typically manufactured at the minimum gate length that can be reliably formed (e.g., photolithographically printed) and still yield acceptable electrical performance characteristics. Device miniaturization has brought the minimum gate length down to 0.25–1.0 μm. As the minimum gate length is reduced, physical parameters such as gate dielectric thickness, source/drain junction depth, net channel doping, threshold voltage, and supply voltage are adjusted together according to appropriate scaling rules. This enables MOS transistors to be fabricated at small dimensions without the deleterious effects, such as non-saturating output characteristics, threshold-voltage dependence on channel length, and drain-induced current leakage, that are associated with short-channel FETs.

The gate dielectric thickness and source/drain junction depth usually scale in an approximately proportional manner with the gate length. The channel doping scales inversely with the gate length. However, the threshold voltage varies with the gate length in a more complicated manner. In fact, the threshold voltage is sometimes described as not scaling with the gate length.

Various techniques have been employed in the prior art to address the non-scalability of the threshold voltage. One of the techniques is to perform a global (blanket) ion implantation into the channel of an FET so as to independently adjust its threshold voltage. FIGS. 1 and 2 are helpful in understanding the effect of a global threshold-adjust implant.

FIG. 1 illustrates a conventional n-channel MOS transistor 10 in which a threshold-adjust implant is not used. FET 10 is created from p- monocrystalline silicon ("monosilicon") substrate 11 having p well 12. Channel zone 13 separates n++ source 14 and n++ drain 15. Gate dielectric layer 16, typically silicon oxide, electrically insulates n++ polycrystalline silicon ("polysilicon") gate electrode 17 from channel 13. The gate length and thus also the channel length, which is slightly less than the gate length, are measured horizontally in the plane of FIG. 1. Items 18 and 19 respectively indicate the well-side boundaries of the source-well and drain-well depletion regions when the gate-to-source voltage, commonly referred to as the gate bias, is zero, and the drain-to-source voltage is at a positive (e.g., 5-V) operating value.

As the gate length is reduced, all the other transistor parameters being the same in FET 10, the source-well depletion region approaches the drain-well depletion region. If the gate length is reduced to such a value that the source-well depletion region meets the drain-well depletion region, the operative length of channel 13 is reduced to zero even though the metallurgical (source-junction-to-drain-junction) channel length is greater than zero. Source 14 punches through to drain 15, enabling current to flow from source 14 to drain 15 with zero gate bias. The drain current increases in a rapid, undesirable manner with increasing drain voltage. FET 10 is disabled as an amplifying or switching device.

FIG. 2 depicts an n-channel MOS transistor 20 configured generally the same as FET 10 except that a light dosage of p-type dopant is globally provided in channel 13 to adjust the FET threshold voltage. Because the threshold-adjust dopant is of the same conductivity type (p-type) as well 12, the threshold voltage is increased. The threshold adjustment is typically performed by ion implanting boron (or a boron-containing species) through the upper silicon surface in a blanket manner—i.e., without using an implant mask—and later performing an anneal to activate the implanted boron. Item 21 generally indicates the location of the threshold-adjust dopant. The resulting vertical dopant concentration profile through the center of FET 20 is shown in FIG. 3.

Use of a threshold-adjust implant permits the threshold voltage to be controlled independently of the doping in well 12 and substrate 11. Importantly, the well/substrate doping can be reduced so as to reduce the source/drain junction capacitances, thereby enabling FET 20 to switch faster. Although reduced well/substrate doping enables the depletion regions for source 14 and drain 15 to become wider below zones 14 and 15, the increased p-type doping in channel 13 reduces the distance by which the drain-well depletion region extends into channel 13. This reduces the likelihood of source-drain punchthrough. At the same time, the overall structure of the electric field in the vicinity of the drain-well junction is more relaxed. Consequently, the drain-to-well breakdown voltage is increased.

Also, when p well 12 is reverse biased with respect to source 14, the threshold voltage effectively increases due to the so-called "body effect". Specifically, the gate voltage needed to reach channel conduction must be increased to compensate for the additional fixed charge exposed in the channel depletion region below gate electrode 17 as a result of the well-to-source reverse biasing. The threshold-adjust implant reduces the body effect and thus the amount by which the threshold voltage is increased during such operation.

The improvement in the body effect and the ability to independently control the threshold voltage can be seen by first considering the following equations for a simple long-channel MOS transistor of the type generally shown in FIG. 1 except that substrate 11 and well 12 are replaced with a uniformly doped silicon substrate:

$$V_T = V_{FB} + 2\phi_{F_p} + \frac{|Q_B|}{C_{ox}} \quad (1)$$

$$|Q_B| = qN_B y_{dmax} \quad (2)$$

-continued $$y_{dmax} = \sqrt{\frac{2K_s\varepsilon_0(V_B + 2\phi_{F_p})}{qN_B}} \quad (3)$$

$$\phi_{F_p} = \frac{kT}{q}\ln\frac{N_B}{n_i} \quad (4)$$

where: $V_T$ is the threshold voltage, $V_{FB}$ is the flat-band voltage, $\phi_{F_p}$ is the Fermi potential of the p-type channel material, $Q_B$ is the bulk charge density per unit in the surface depletion region (below the gate electrode), $C_{ox}$ is the gate-oxide capacitance per unit area, $N_B$ is the average net dopant concentration per unit volume in the substrate, $Y_{dmax}$ is the maximum depletion width of the surface depletion region at inversion, $V_B$ is the substrate bias voltage, $n_i$ is the intrinsic carrier concentration of silicon, q is the electronic charge, $K_s$ is the relative dielectric constant of silicon, $\varepsilon_0$ is the permittivity of free space, and T is the absolute temperature.

At fixed substrate bias voltage $V_B$ and interface properties, maximum depletion width $Y_{dmax}$ is essentially fixed. Oxide-capacitance parameter $C_{ox}$ is a function of the gate oxide thickness. If the gate oxide thickness is also fixed, threshold voltage $V_T$ is controlled by bulk charge density $Q_B$ and, per Eq. 2, thus by average substrate dopant concentration $N_B$. Threshold voltage $V_T$ increases as substrate doping $N_B$ increases, and vice versa.

When the threshold-adjust implant is utilized, Eq. 1 is replaced with:

$$V_T = V_{FB} + 2\phi_{F_p} + \frac{|Q_B|}{C_{ox}} + \frac{qN_{Th}}{C_{ox}} \quad (5)$$

where $N_{Th}$ is the net dopant concentration per unit area of the threshold-adjust layer. Threshold-adjust dopant concentration $N_{Th}$ can be used to change threshold voltage $V_T$, thereby allowing voltage $V_T$ to be adjusted without changing substrate doping $N_B$. Also, the use of the threshold-adjust implant enables a given $V_T$ value to be obtained at a lower $N_B$ value. According to Eqs. 2–5, this makes voltage $V_T$ less sensitive to substrate bias variations because the additional channel depletion charge caused by substrate bias $V_B$ occurs in a more lightly doped substrate.

Upon considering the FET short-channel effect, Eq. 5 is modified to become:

$$V_T = V_{FB} + 2\phi_{F_p} + f\frac{|Q_B|}{C_{ox}} + \frac{qN_{Th}}{C_{ox}} \quad (6)$$

In Eq. 6, f is a geometrical factor less than one as determined from:

$$f = 1 - \frac{d_J}{L_c}\left(\sqrt{1 + 2\frac{y_{dmax}}{d_J}} - 1\right) \quad (7)$$

where $d_J$ is the source junction depth, and $L_c$ is the channel length. Eqs. 6 and 7 are provided from the simplified model of Yau, "A Simple Theory to Predict the Threshold Voltage in Short-Channel IGFETs," *Solid-State Elecs.*, 1974, pages 1059–1069. Taking into account the fact that $Y_{dmax}$ varies with the inverse square root of substrate doping $N_B$ according to Eq. 3, Eqs. 6 and 7 together indicate that the $V_T$ reduction which occurs when channel length $L_c$ is of comparable value to source junction depth $d_j$ can be reduced if substrate doping $N_B$ is reduced.

A threshold-adjust implant can be used in virtually all CMOS and BiCMOS fabrication processes where the minimum feature size—i.e., the gate length—is less than 1 µm. As device miniaturization continues, usage of the threshold-adjust implant is expected to continue. It is important that modifications to the structure and fabrication of FETs be developed with a threshold-adjust implant in mind.

While use of a global threshold implant enables the threshold voltage to be adjusted independently of substrate doping $N_B$, the transistor current drive depends on the channel doping and thus is coupled to the threshold voltage. It would be desirable to weaken this coupling in such a way that the current drive characteristics can be improved without detrimentally affecting the threshold characteristics.

Another important FET design consideration is the breakdown voltage at the drain. The drain-junction breakdown voltage decreases as the background doping increases. Referring to FET 20 in FIG. 2, the doping in p well 12 is, as mentioned above, reduced when a global threshold implant is used. Use of the threshold-adjust implant thus causes the drain breakdown voltage to be improved by relaxing the electric field along the bottom portion of the drain-to-well junction. It would be desirable to further improve the drain breakdown voltage yet still be able to control the threshold voltage independently of substrate doping $N_B$.

In the device of FIG. 1 or 2, avalanche breakdown at the drain junction occurs near the upper semiconductor surface where the drain junction meets gate oxide 16. This situation, customarily referred to as surface breakdown, impairs device reliability. In particular, when the gate-to-source voltage exceeds the threshold value, some of the charge carriers (electrons) moving towards the drain become sufficiently energetic (hot) in the vicinity of the drain junction along the upper semiconductor surface that they are injected into gate oxide 16 and become trapped there. Gate oxide 16 becomes permanently charged, causing the threshold voltage and FET transconductance to drift with time.

One solution to the hot-carrier problem is to use a lightly doped drain ("LDD") structure for reducing the magnitude of the drain dopant concentration at the upper semiconductor surface where the drain terminates the channel. See Ogura et al, "Design and characteristics of the Lightly Doped Drain-Source (LDD) Insulated Gate Field-Effect Transistor," *IEEE Trans. Elec. Devs.*, August 1980, pages 1359–1367. Also see Ogura et al, "Elimination of Hot Electron Gate Current by the Lightly Doped Drain-Source structure," *IEDM, Tech. Dig.* 1981, pages 651–654.

The LDD solution is exemplified by n-channel MOS transistor 30 in FIG. 4. FET 30 is configured similarly to FET 20 except in the vicinity of the source and drain. As indicated in FIG. 4, the drain of FET 30 consists of n++ main portion 31 and more lightly doped n+ extension 32. The source is similarly formed with n++ main portion 33 and more lightly doped n+ extension 34. Dielectric spacers 35 and 36 control the laterally dimensions of n+ extensions 32 and 34. In the conventional example of FIG. 4, FET 30 is provided with a global threshold-adjust implant indicated by p+ layer 21.

At constant gate length, drain extension 32 in FET 30 has a lower doping than drain 15 in FET 20. The electric field at the drain end of the channel is thus lower in FET 30 than in FET 20. As a result, fewer charge carriers in FET 30 become sufficiently energetic to cause a hot-carrier problem. Inasmuch as the LDD technique is widely used in VLSI products, it is desirable that improvements to the structure and fabrication of FETs be compatible with the LDD technique.

Transistors that are fabricated with geometries of minimum-feature size so as to efficiently perform digital signal processing at 5 V or less generally do not interface well with the outside world where voltages considerably above 5 V are commonly encountered. For example, consider the situation when gate electrode 17 of FET 30 is of minimum printable length. Because (a) main drain portion 31 is relatively close to main source portion 33 and (b) gate oxide 16 is relatively thin, subjecting FET 30 to a voltage considerably above 5 V would produce such an intense electric field in the vicinity of main drain portion 31 that FET 30 would breakdown according to a mechanism such as source-to-drain punchthrough.

A manufacturing process used to fabricate low-voltage PETs for a VLSI circuit must invariably also provide differently designed FETs that can perform high-voltage analog or digital functions for interfacing with the outside world. One way of addressing the high-voltage interface problem is to increase the distance between the heavily doped source and drain regions to a value great enough to allow room for the drain electric field to extend into the channel without causing punchthrough breakdown.

FIG. 5 depicts a conventional high-voltage n-channel MOS transistor 40 of the type described in Erb et al, "A High Voltage Ion Implanted MOSFET," *IEDM Tech. Dig.*, 1971, page 158. FET 40 is configured similar to FET 10 except at the drain. The drain of FET 40 is formed with n++ main portion 41 and more lightly doped n+ extension 42. For the same minimum feature size, n+ drain extension 42 in FET 40 is considerably longer than n+ drain extension 32 in FET 30. Also, gate electrode 17 and, consequently, channel 13 are correspondingly longer in FET 40 than in FET 30. Because FET 40 has more room for the electric field to expand in both directions from the drain end of channel 13, FET 40 can tolerate higher drain voltages without having the drain electric field become high enough to cause avalanche breakdown at the drain.

Unfortunately, increasing channel length generally leads to a decrease in current-drive capability. For example, when a device such as FET 40 is performing an analog function at high current, the drain saturation current $I_{Dsat}$ is given by the classical relationship for strong inversion operation:

$$I_{Dsat} = \frac{\mu_n W}{L_C} \left\{ \begin{array}{c} C_{ox} V_{Dsat} \left( V_G - V_{FB} - 2|\phi_{Fp}| - \frac{V_{Dsat}}{2} \right) - \\ \frac{8}{3}\sqrt{K_s \epsilon_o q N_B |\phi_{FP}|^2} \left[ \left( 1 + \frac{V_{Dsat}}{2|\phi_{FP}|} \right)^{3/2} - 1 \right] \end{array} \right\} \quad (8)$$

where $\mu_n$ is the electron mobility, W is the channel width, $V_G$ is the gate voltage, and $V_{Dsat}$ is the drain saturation voltage determined from:

$$V_{Dsat} = V_G - V_{FB} - 2\phi_{F_p} - \frac{K_s \epsilon_o q N_B}{C_{ox}^2} \left[ \sqrt{1 + \frac{2C_{ox}^2(V_G - V_{FB})}{K_s \epsilon_o q N_B}} - 1 \right] \quad (9)$$

As Eq. 8 indicates, increasing channel length $L_c$ causes drain saturation current $I_{Dsat}$ to decrease. It would be desirable to have a technique for recovering some of the current drive lost when the channel length is increased to a value greater than the minimum manufacturable channel length.

In some analog applications, FETs need to operate at relatively low drain current. Such transistors are usually operated in weak or moderate inversion near the on/off threshold point. Large voltage gains and large voltage output swings can be achieved in weak or moderate inversion because the drain saturation voltage is typically a minimum and the output conductance is essentially zero. Unfortunately, the best performance at weak or moderate inversion has been achieved in the prior art only when the drain current per unit source/drain width is very low. This normally requires that the source and drain be quite wide to achieve a usable level of drain current.

For operation in weak or moderate inversion near the on/off threshold, the transconductance-to-current quotient is a useful parameter of merit. The transconductance-to-current quotient indicates how much transconductance is produced for each unit of output current. It is desirable to increase the drain current per unit source/drain width in weak or moderate inversion without degrading the transconductance-to-current quotient. The drain current can then reach a usable level without exaggeratedly increasing the source/drain width.

Increasing the steepness by which the drain current varies with the gate voltage in the vicinity of the on/off threshold causes an FET to be a better switch. Accordingly, it is desirable to increase the turn-on/turn-off steepness. This is particularly important as VLSI circuits are scaled downward because an FET having a low threshold voltage must turn off abruptly when the gate-to-source voltage drops below the threshold voltage to avoid current leakage at zero gate bias.

FIG. 6 illustrates an approach presented in Armijos, "High-Speed DMOS FET Analog Switches and Switch Arrays," Application Note AN301, *Low-Power Discretes*, Siliconix, Jun. 22, 1994, page 33–42 for increasing the breakdown voltage of a discrete high-voltage n-channel FET 50 created from p– monosilicon substrate 51. The drain consists of n+ main drain portion 52 and n-type drain extension 53 which meets channel zone 54 below gate electrode 55. Drain extension 53 is much shallower than main drain portion 54.

A double-diffusion process is utilized in Armijos to create p body region 56 which extends along n+ source 57 and into channel 54. This results in a peaked p-body dopant profile in which the dopant concentration of p body region 56 along the upper semiconductor surface progressively increases and then decreases in going from the right-hand side of source 57 to the right into channel 54 in FIG. 6. Armijos states that body region 56 acts to isolate source 57 from the drain.

Application of the high-voltage discrete FET of FIG. 6 to VLSI circuits such as CMOS or BiCMOS devices is impractical because the use of a LDD extension much shallower than the main drain portion leads to an unacceptably high drain series resistance. Also, the high curvature of drain extension 53 of the drain end of channel 54 results in a drain breakdown voltage that is unacceptably low for VLSI circuits.

GENERAL DISCLOSURE OF THE INVENTION

The present invention furnishes an insulated-gate field-effect transistor that utilizes a local threshold-adjust doping to control the voltage at which the FET turns on. The local threshold-adjust doping, normally implemented by a selective ion-implantation procedure, is present along part, but not all, of the lateral extent of the FET's channel.

In a VLSI circuit, the local threshold-adjust doping is typically applied to FETs whose gate length is greater than the minimum feature size of the process utilized to fabricate the FETs. Consequently, the channels of the present FETs are longer than the channels of minimum-size FETs which perform the main digital signal processing in the circuit. Preferably, the gate length of an FET that contains the local threshold-adjust doping is at least 50% greater than the minimum reliably manufacturable gate length. The present FET is thus especially suitable for use in analog and/or high-voltage digital portions of a VLSI circuit.

The transistor structure of the invention centers around a device region of a first conductivity type located in a semiconductive body. A pair of source/drain zones of a second conductivity type opposite to the first conductivity type are situated in the semiconductive body along its upper surface. A channel zone of the device region laterally separates the source/drain zones. A gate electrode for controlling conduction in the channel zone is situated above the channel zone and is vertically separated from it by gate dielectric material.

The channel zone is formed with a main channel portion and a more heavily doped threshold channel portion that contains the local threshold-adjust doping. The threshold channel portion is electrically in series with the main channel portion between the source/drain zones. Part of the threshold channel portion usually has a net dopant concentration which is largely constant along the upper semiconductive surface in a direction extending between the source/drain zones.

The threshold channel portion can be situated at various locations in the channel zone. In one implementation, the threshold channel portion is laterally separated from both source/drain zones. The main channel portion is then situated between the threshold channel portion and one of the source/drain zones. An additional main channel portion is situated between the threshold channel portion and the other source/drain zone. The threshold channel portion is more heavily doped than the additional main channel portion.

Either of the source/drain zones can function as the source in the preceding implementation. The other source/drain zone then functions as the drain. In fact, the transistor can be operated in such a way that one of the source/drain zones is the source at certain times and the drain at other times.

In other implementations, one of the source/drain zones is permanently the source, while the other source/drain zone is permanently the drain. Preferably, the threshold channel portion laterally adjoins the source. The main channel portion then extends from the threshold channel portion to the drain.

The output current-drive characteristics of the present FET are less coupled to its threshold and sub-threshold characteristics than in an otherwise equivalent conventional FET that employs a global threshold-adjust implant. In particular, the main channel portion primarily determines the current-drive characteristics in the FET of the invention. The threshold channel portion, on the other hand, determines the threshold and sub-threshold characteristics. This occurs because the threshold channel portion is more heavily doped than, and of the same conductivity type as, the main channel portion.

The main channel portion is normally in an on condition when a voltage nearly sufficient to turn on the present FET is applied to the gate electrode. However, the threshold channel portion is off, thereby preventing current from moving between the source/drain zones by way of the channel zone. Accordingly, the transistor is turned off. When a voltage adequate to turn on the transistor is applied to the gate electrode, the threshold channel portion turns on. Current can then move between the source/drain zones by way of the channel zone. In this way, the threshold channel portion acts as a gate-controlled current bottleneck that establishes the threshold and sub-threshold characteristics.

Use of the local threshold-adjust doping enables the current-drive characteristics of the present FET to be set at desirable values without sacrificing control over the threshold characteristics. The invention is thereby more flexible than the prior art, as exemplified by the threshold-adjusted FET of FIG. 2, where the strong coupling of the threshold characteristics to the current-drive characteristics can lead to degradation in one of the two types of characteristics when the other type of characteristics is being improved.

More particularly, the present transistor has better current-drive capability than an otherwise comparable long-channel FET which lacks the local threshold-adjust doping of the invention. In particular, during strong inversion, the drain saturation current of the present FET at the same or higher drain saturation voltage is increased as the result of a decrease in the transistor's linear-region on-resistance.

When the transistor of the invention is operated in weak or moderate inversion near the on/off threshold, higher drain current per unit source/drain width is obtained without significantly degrading the transconductance-to-current quotient. Importantly, usable levels of drain current are obtained in weak or moderate inversion without exaggeratedly increasing the source/drain width.

The turn-on/turn-off steepness of the present transistor is better than that of a comparable long-channel FET lacking the local threshold-adjust doping. This enables the present FET to switch better. Also, the transistor of the invention is well suited for VLSI applications where the threshold voltage is scaled down to very low values—e.g. 0.25 V—and where the presence of such a low threshold voltage necessitates an abrupt turn-off in order to avoid substantial current leakage at zero gate bias.

When the threshold channel portion adjoins the source, the present transistor has a greater drain breakdown voltage than a comparable long-channel FET which lacks the local threshold-adjust doping of the invention. An improvement in the drain breakdown voltage is also achieved when the threshold channel portion is laterally separated from both source/di in zones. In short, the local threshold-adjust doping enables the present FET to perform considerably better than otherwise equivalent prior art FETs.

In fabricating the FET structure of the invention, semiconductor dopant of the first conductivity type is first introduced into a portion of a semiconductive body intended for the threshold channel portion. The threshold-adjust dopant introduction normally entails selectively implanting ions of the first conductivity type using an implant shield to prevent the ions from entering the portion of the semiconductive body intended for the main channel portion. The gate electrode is subsequently provided above, and insulatingly spaced apart from, the channel zone. Semiconductor dopant of the second conductivity type is introduced into the semiconductive body to form the source/drain zones.

The present FET structure can readily be fabricated in a lightly doped drain configuration. That is, the source/drain zone functioning as the drain zone can be formed with a main portion and a more lightly doped portion that adjoins the channel zone. Premature breakdown in the vicinity of the drain zone is avoided. Use of the LDD configuration also helps to prevent hot-carrier effects from causing the threshold voltage and FET transconductance to drift during FET operation.

The FET of the invention can be employed with other transistors of various types. For example, the present structure can include a like-polarity FET whose gate electrode is of the minimum reliably manufacturable length—i.e., the minimum feature size. The gate electrode of the present FET is at least 50% longer than the gate electrode of the minimum-gate-length device. The present FET can be utilized with a complementary FET in a CMOS or BiCMOS configuration. The channel zone of the complementary FET then similarly contains a main channel portion and a more heavily doped threshold channel portion. In short, the present invention provides a versatile, high-performance FET that can be readily incorporated into a production VLSI circuit.

BRIEF DESCRIPTION OF THE DRAWINGS

FIGS. 10a–10c (collectively "FIG. 10") are cross-sectional views of a CMOS structure that utilizes local threshold-adjust doping in accordance with the invention. The cross section of FIG. 10a is taken through plane 10a—10a in FIGS. 10b and 10c. The cross sections of FIGS. 10b and 10c are respectively taken through planes 10b—10b and 10c—10c in FIG. 10a.

FIG. 11 is a simplified layout view of the CMOS structure of FIG. 10 below the gate electrode and gate dielectric.

FIGS. 15.1 and 15.2 are three-dimensional dopant-concentration graphs of computer simulations respectively for (a) an implementation of the long-gate n-channel FET of FIG. 10 and (b) a reference n-channel FET constituted with a long-gate implementation of the LDD FET of FIG. 4.

FIGS. 16.1 and 16.2 respectively are lateral and vertical dopant profiles for an implementation of the n-channel FET of FIG. 10 examined in computer simulations.

FIGS. 17.1 and 17.2 are graphs of drain current per unit source/drain width as a function of gate voltage for implementations of the n-channel FET of FIG. 10 examined in computer simulations at various values of the gate length portion corresponding to the threshold channel length.

FIGS. 19.1 and 19.2 are three-dimensional graphs of electrical potential respectively for computer simulations of (a) an implementation of the long-gate n-channel FET of FIG. 10 and (b) the reference long-gate n-channel FET.

FIGS. 20.1 and 20.2 are graphs of drain current per unit source/drain width as a function of gate voltage for computer simulations of (a) an implementation of the long-gate n-channel FET of FIG. 10 and (b) the reference long-gate n-channel FET.

FIG. 21 is a graph of drain-current ratio and transconductance-to-current quotient ratio as a function of gate voltage for computer simulations of implementations of the long-gate n-channel FET of FIG. 10 relative to the reference long-gate n-channel FET.

FIGS. 22.1–22.3 are graphs of drain current per unit source/drain width as a function of drain voltage in weak and moderate inversion for computer simulations of (a) an implementation of the long-gate n-channel FET of FIG. 10, (b) the reference long-gate n-channel FET, and (c) another reference FET constituted with a minimum-gate-length implementation of the LDD n-channel FET of FIG. 4.

Figure 1:
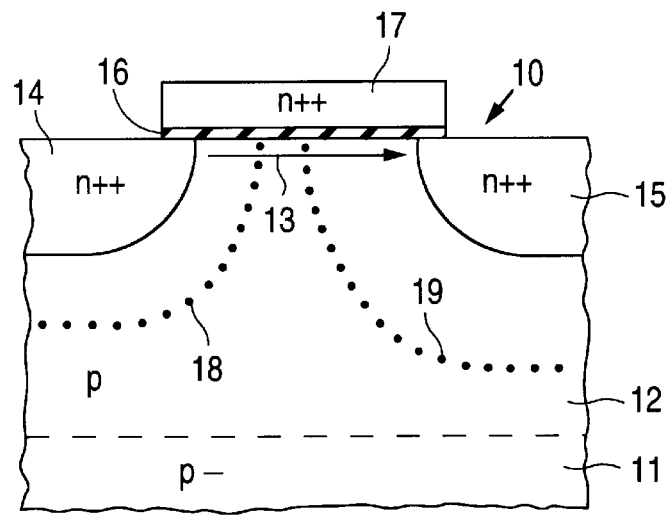
FIG. 1 is a cross-sectional view of a basic conventional n-channel insulated-gate FET at a condition of zero gate bias.
Figure 2:
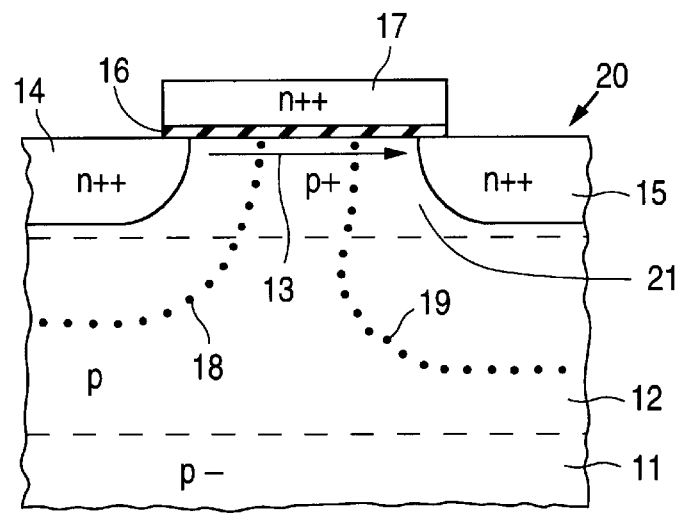
FIG. 2 is a cross-sectional view of a conventional n-channel insulated-gate FET having a global threshold-adjust implant, the gate bias being zero.
Figure 3:
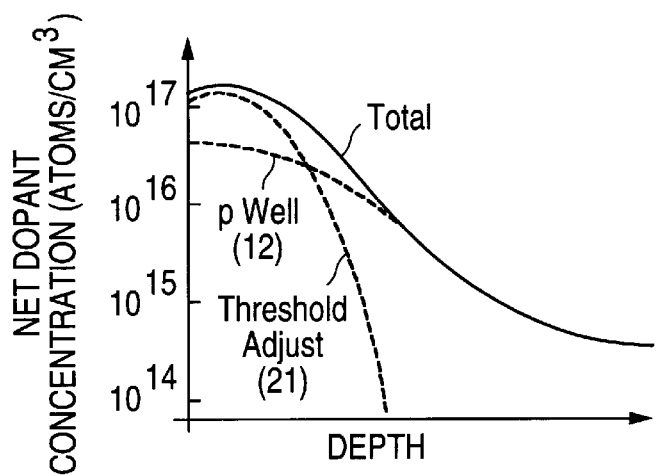
FIG. 3 is a vertical dopant profile through the center of the FET in FIG. 2.

Like reference symbols are employed in the drawings and in the description of the preferred embodiments to represent the same or very similar item or items. In the drawings, horizontal arrows represent surface channel zones and portions of surface channel zones. The numerical portions of starred reference symbols in the dopant concentration graphs respectively indicate like-numbered regions or zones in earlier structural views.

DESCRIPTION OF THE PREFERRED EMBODIMENTS

Figure 7:
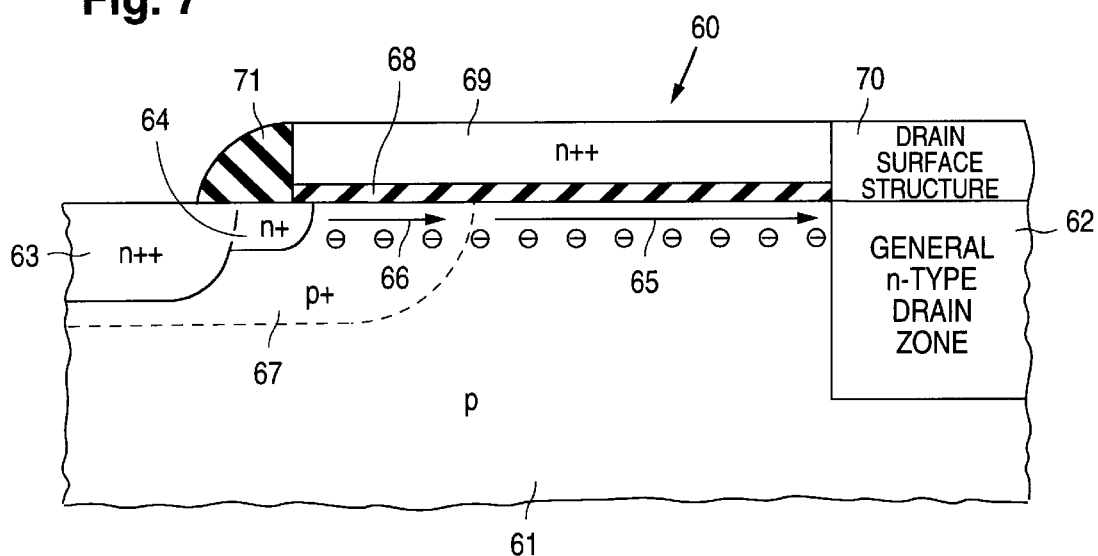
FIG. 7 is a cross-sectional view of an embodiment of a long-gate n-channel insulated-gate FET in which local threshold-adjust doping is provided to form a multi-part channel zone in accordance with the invention.

Referring to FIG. 7, it illustrates a general embodiment of a structure for an enhancement-mode long-gate n-channel insulated-gate FET 60 having a multi-part channel zone in accordance with the teachings of the invention. FET 60 is suitable for use in an integrated circuit, particularly a VLSI circuit, such as an NMOS, CMOS, or BiCMOS product. FET 60 is created from a moderately doped p-type main body (or device) region 61 of a monosilicon semiconductive body. Main body region 61 is typically a well region formed in a lightly doped (either p-type or n-type) or intrinsic (substantially undoped) part (not shown) of the semiconductive body.

FET 60 has a generalized n-type drain zone 62 and an n-type source zone consisting of a heavily doped main portion 63 and a more lightly doped extension 64. Formed as a by-product of creating drain zone 62 in an LDD configuration described below, source extension 64 normally does not perform a useful operational function. The source of FET 60 could alternatively be represented as a single n-type source zone.

A two-part surface channel zone laterally separates drain zone 62 and composite source zone 63/64 from each other in the semiconductive body. The two-part channel zone is provided with a local threshold-adjust doping in such a manner that the channel zone consists of a main channel portion 65 and a more heavily doped threshold channel portion 66. Main channel portion 65 is situated in the p-type material of main body region 61 along the upper surface of the semiconductive body. Threshold channel portion 66, also located along the upper semiconductor surface, is part of a high moderately doped p-type threshold body region 67 formed in p main body region 61. The dashed lines in FIG. 7 indicate the general location at which the additional dopant concentration provided by the local threshold-adjust doping in threshold body region 67 approximately equals the background dopant concentration of p device region 61.

In the embodiment shown in FIG. 7, main channel portion 65 is located between, and laterally adjoins, threshold channel portion 66 and n-type drain zone 62. Threshold channel portion 66 laterally adjoins n+ source extension 64. As a result, channel portions 65 and 66 are situated electrically in series between source zone 63/64 and drain zone 62. Threshold body region 67 laterally adjoins source zone 63/64.

FET 60 is intended primarily for applications where source zone 63/64 permanently functions as the FET source, and drain zone 62 permanently functions as the FET drain. The multi-part channel zone of the present invention can be configured in other ways suitable for other types of applications as discussed below in connection with FIGS. 24–27.

A gate dielectric layer 68 of silicon oxide electrically insulates, and vertically separates, channel zone 65/66 from a heavily doped n-type polysilicon gate electrode 69 that extends slightly over n+ source extension 64. A generalized drain surface structure 70 overlies drain zone 62 along the drain side of gate electrode 69. Drain surface structure 70 invariably includes small polysilicon and gate-oxide portions (not shown) that are respectively continuous with gate electrode 69 and gate oxide 68.

Drain zone 62 and drain surface structure 70 are shown generally in FIG. 7 because their configuration is not critical to the operation of the multi-part channel zone of the invention. Specific examples of drain zone 62 and surface structure 70 are described below in connection with later drawings.

A dielectric spacer 71 of silicon oxide adjoins the source side of gate electrode 69. Spacer 71 extends generally over the upper semiconductor surface area where n++ main source portion 63 merges into n+ source extension 64.

Figure 8:
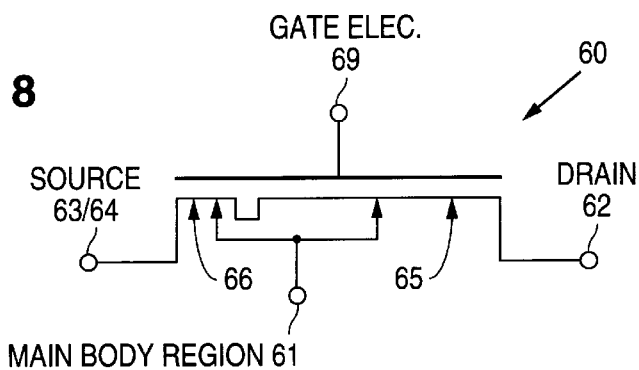
FIG. 8 is a circuit representation of the long-gate n-channel FET of FIG. 7.

FIG. 8 illustrates a simplified electrical model of FET 60. Because channel portions 65 and 66 are connected in series between source zone 63/64 and drain zone 62, both of channel portions 65 and 66 must be conductive for FET 60 to be turned on. If either channel portion 65 or 66 is non-conductive, FET 60 is turned off.

More particularly, the doping level in threshold channel portion 66 (and thus also in threshold body region 67) determines the threshold voltage $V_T$ at which FET 60 turns on. This occurs because threshold channel portion 66 is more heavily doped than main channel portion 65 and thereby requires a higher potential to become conductive than that needed by main channel portion 65. In addition to controlling the transistor threshold (turn-on) characteristics, threshold channel portion 66 also controls the sub-threshold characteristics of FET 60.

The threshold voltage $V_T$ for FET 60 is positive, typically in the range of 0.5–1.0 V depending on the minimum feature size of the scaled VLSI process utilized to manufacture FET 60. When the gate-to-source voltage $V_{GS}$ is well below $V_T$ (e.g., near 0 V), channel portions 65 and 66 are both off. FET 60 is off. When gate-to-source voltage $V_{GS}$ is increased to a value close to, but below, $V_T$, main channel portion 65 becomes capable of conducting. However, threshold channel portion 66 is still non-conductive so that FET 60 remains off. When voltage $V_{GS}$ is raised to $V_T$, threshold channel portion 65 finally becomes conductive. An n channel which extends from source zone 63/64 to drain zone 62 is induced in channel portions 65 and 66, enabling PET 60 to turn on. The reverse occurs when gate-to-source voltage $V_{GS}$ is educed from $V_T$ to a value well below $V_T$.

Main channel portion 65 is normally longer, as measured horizontally in FIG. 7, than threshold channel portion 66. The transistor saturation resistance is thus primarily determined by the saturation characteristics of main channel portion 65 where the channel pinch-off that controls the saturation characteristics takes place. As a result, main channel portion 65 largely determines the output current-drive characteristics, particularly the drain saturation current, of FET 60 during normal FET operation.

Threshold channel portion 66, as a part-of threshold body region 67, is preferably formed by an implantation/anneal procedure in which ions of a p-type dopant (usually boron or a boron-containing species) are implanted through the upper semiconductor surface using a suitable shield (typically photoresist) to prevent the p-type ions from entering main channel portion 65. The local threshold-adjust implantation for threshold channel portion 66 is performed through part of the upper semiconductor surface where gate electrode 69 is later created. The length of gate electrode 69, measured horizontally in FIG. 7 along the lower gate surface, is thus greater than the minimum feature size that can be reliably created according to the fabrication process used to manufacture FET 60. Specifically, the gate length is greater than the length of the gate electrode in an otherwise-equivalent minimum-size FET which lacks threshold body portion 66.

The gate length in FET 60 is usually at least 50% greater than the minimum gate length which can be reliably formed. In the process used to fabricate FET 60, channel length increases linearly with gate length at a given minimum feature size. Accordingly, composite channel zone 65/66 is considerably longer than the minimum formable channel length. This enables FET 60 to withstand higher voltage than FETs of minimum channel length. FET 60 is thus especially suited for high-voltage usage in analog and/or high-voltage digital portions of an integrated circuit. The minimum total length for channel zone 65/66 is set at a value high enough to avoid punchthrough and avalanche breakdown at the maximum drain-to-source voltage normally experienced during transistor operation.

When long-gate FET 60 is used in the analog and/or high-voltage digital portions of a VLSI circuit, the low-voltage digital functions in the circuit are typically performed with minimum-size insulated-gate FETs whose channels are of approximately the same length as threshold channel portion 65. As a result, FET 60 has approximately the same threshold voltage as minimum-size n-channel FETs in the VLSI circuit. Alternatively, as described further below, the length of threshold channel portion 66 can be controlled in such a way as to set the threshold voltage of FET 60 at a value below the threshold voltage of the minimum-size n-channel FETs. Both of these capabilities are especially advantageous in applications, such as watches, where a low supply voltage—e.g., 1.5 V—necessitates a low threshold voltage.

Figure 9:
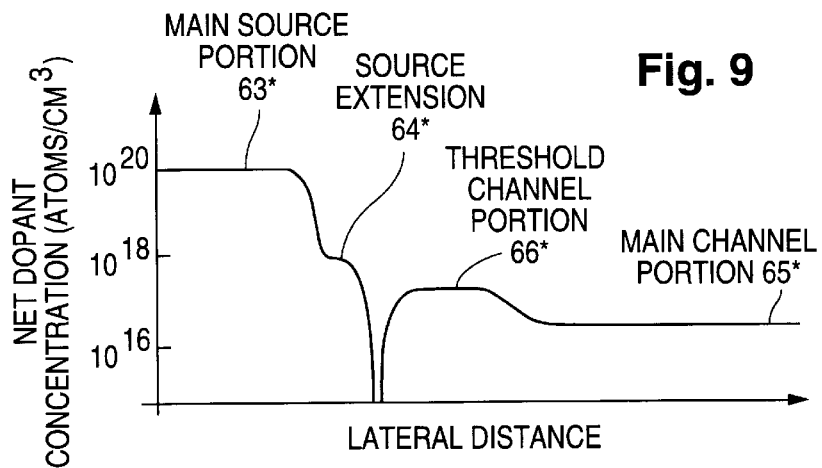
FIG. 9 is a lateral dopant profile along the upper semiconductor surface for the n-channel FET of FIG. 7.

FIG. 9 illustrates a typical dopant profile for FET 60 along the upper surface of the semiconductive body. The net dopant concentration in threshold channel portion 66 along the upper semiconductor surface is substantially constant— i.e., flat—for a sizable percentage, typically at least 50%, of the length of threshold channel portion 66 in the direction from source zone 63/64 to drain zone 62 (or vice-versa). This arises because the local threshold-adjust doping is introduced into threshold channel portion 66 by ion implantation through the upper semiconductor surface.

In a typical implementation based on a 2-$\mu$m length for gate electrode 69, threshold channel portion 66 has a net dopant concentration of $5 \times 10^6$–$5 \times 10^{17}$ atoms/cm$^3$, typically $1.3 \times 10^{17}$ atoms/cm$^3$, at the upper semiconductor surface. For the preferred case in which gate oxide layer 68 has a thickness of 12–14 nm, typically 13 nm, threshold voltage $V_T$ is 0.5–0.8 V, typically 10 0.65 V.

The net dopant concentration of threshold channel portion 66 is usually 3–5 times the net dopant concentration of main channel portion 65. Specifically, main channel portion 65 has a net dopant concentration of $1 \times 10^{16}$–$1 \times 10^{17}$ atoms/cm$^3$, typically $3 \times 10^{16}$ atoms/cm$^3$, at the upper semiconductor surface for a 2-$\mu$m gate length. The nominal net dopant concentration for main channel portion 65 is the same as that needed to achieve the desired threshold voltage for minimum-size n-channel insulated gate FETs used in the low-voltage digital portions of the VLSI circuit.

The net dopant concentration of n++ main drain portion 63 is $3 \times 10^{19}$–$3 \times 10^{20}$ atoms/cm$^3$, typically $1 \times 10^{20}$ atoms/cm$^3$, at the upper surface of the semiconductive body. Source extension 64 reaches a net dopant concentration of $3 \times 10^{17}$–$3 \times 10^{18}$ atoms/cm$^3$, typically $1 \times 10^{18}$ atoms/cm$^3$, at the upper semiconductor surface.

FIGS. 10a–10c (again collectively "FIG. 10") depict a CMOS structure containing an LDD embodiment of long-gate n-channel FET 60. Drain zone 62 in FIG. 7 is formed with a heavily doped n-type main portion 75 and a more lightly doped n-type extension 76 in FET 60 of FIG. 10.

A sealing layer 77 of silicon oxide covers the top of polysilicon gate electrode 69 in FET 60 of FIG. 10. A dielectric spacer 78 of silicon oxide adjoins the drain side of gate electrode 69 and extends generally over the upper semiconductor surface area where n++ main drain portion 75 merges into n+ drain extension 76. Oxide spacer 78 primarily implements drain surface structure 70 in FIG. 7. Item 79 in FIGS. 10b and 10c is a silicon-oxide dielectric spacer at one end of gate electrode 69.

The CMOS structure of FIG. 10 further includes an enhancement-mode LDD p-channel insulated-gate FET 80.

As with n-channel FET 60, p-channel FET 80 is a long-gate device having a two-part channel zone in accordance with the invention. FET 80 is created from a moderately doped n-type main body (or device) region 81. Main body regions 61 and 81 are well regions formed in a lightly doped p-type layer 82 of the semiconductive body. A heavily doped p-type substrate region (not shown) normally underlies p- layer 82 in the semiconductive body.

FET 80 has a p-type source zone consisting of a heavily doped main portion 83 and a more lightly doped extension 84. A p-type drain zone is formed with a heavily doped main portion 85 and a more lightly doped extension 86. The two-part channel for FET 80 consists of a main channel portion 87 and a more heavily doped threshold channel portion 88. Main channel portion 87 is situated in the n-type material of device region 81 along the upper semiconductor surface. Threshold channel portion 88, likewise situated along the upper semiconductor surface, is part of a high moderately doped n-type threshold body region 89 formed in n device region 81.

Channel portions 87 and 88 are situated electrically in series between the source and drain zones of FET 80. Specifically, main channel portion 87 is located between, and laterally adjoins, threshold channel portion 88 and p+ drain extension 86. Threshold channel portion 88 then laterally adjoins p+ source extension 84. As with n-channel FET 60, p-channel FET 80 is intended for applications where source zone 83/84 permanently functions as the FET source while drain zone 85/86 permanently functions as the FET drain.

A gate dielectric layer 90 of silicon oxide electrically insulates, and vertically separates, channel zone 87/88 from a heavily doped p-type polysilicon gate electrode 91 that extends slightly over source extension 84 and drain extension 86. Dielectric spacers 93 and 94 of silicon oxide are situated respectively along the source and drain sides of p++ gate electrode 91. A sealing layer 95 of silicon oxide covers the top of gate electrode 91.

An electrically insulating field region 96 of silicon oxide is recessed into the semiconductive body along the upper semiconductor surface. Field-insulating region 96 laterally surrounds upper portions of the monosilicon to form isolated semiconductive islands. FET 60 is formed from one of these islands, while FET 80 is created from another of the islands. An annular heavily doped p-type channel-stop region 97 prevents inversion of p device region 61 along the bottom of field oxide 96. This helps isolate FET 60 from other n-channel FETs in the structure.

Drain extension 76 in n-channel FET 60 of FIG. 7 reduces the electric field in the vicinity of drain zone 75/76, thereby increasing the maximum drain-to-source voltage at which impact-ionization-free operation occurs. In doing so, drain extension 76 helps to prevent the threshold voltage and FET transconductance from drifting with time during FET operation and thereby becoming unstable due to hot-carrier effects.

FET 80 operates in the same manner as FET 60 except that the polarities are reversed. Channel portions 87 and 88 in p-channel FET 80 have largely the same respective dimensional characteristics as channel portions 65 and 66 in n channel FET 60. The dopant concentrations in n-type body regions 81 and 89 along the upper semiconductor surface are respectively similar to those of p-type body regions 61 and 67 along the upper semiconductor surface. FET 80 has an adjusted threshold voltage of –0.5 to –0.8 V, typically –0.65 V.

FIG. 11 illustrates the layout of the CMOS structure of FIG. 10 along the upper semiconductor surface. Gate electrodes 69 and 91 and other items situated above the upper surface of the semiconductive body do not appear in FIG. 11.

Figure 12A:
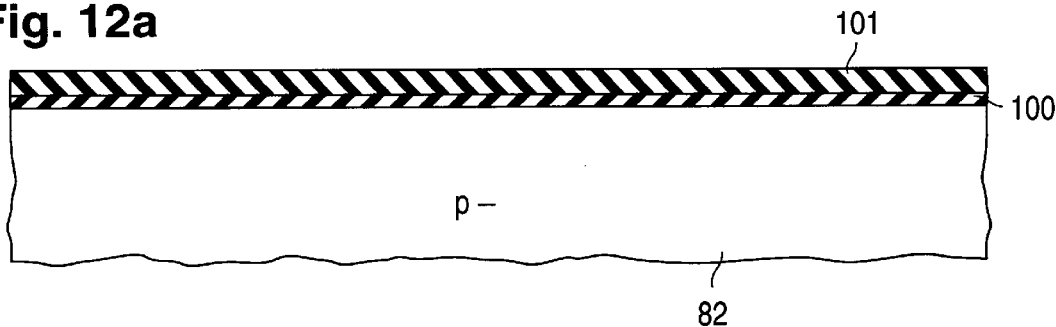
FIGS. 12a–12n are cross-sectional views representing steps in fabricating the CMOS structure of FIG. 10 in accordance with the invention.
Figure 12B:
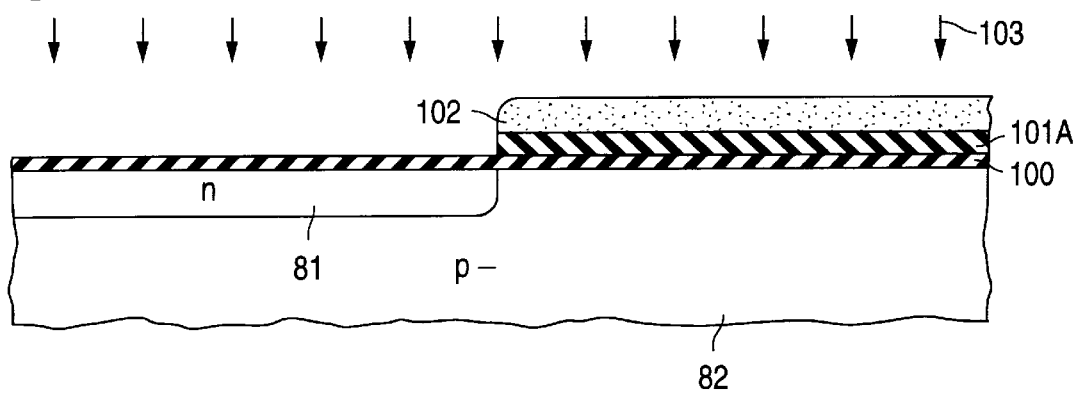
Figure 12C:
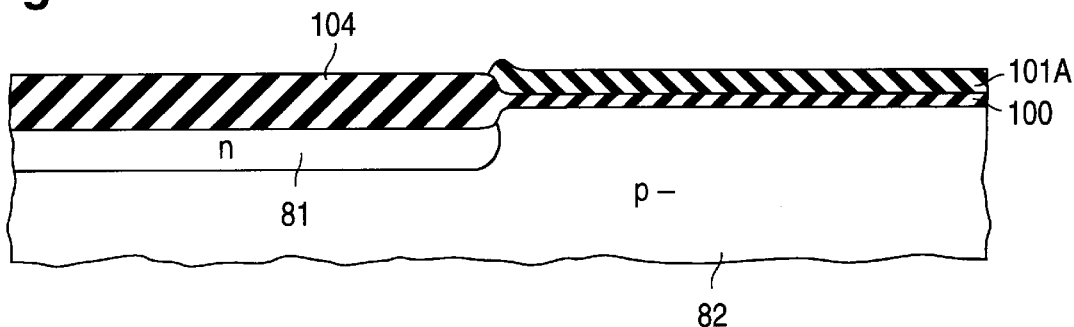
Figure 12D:
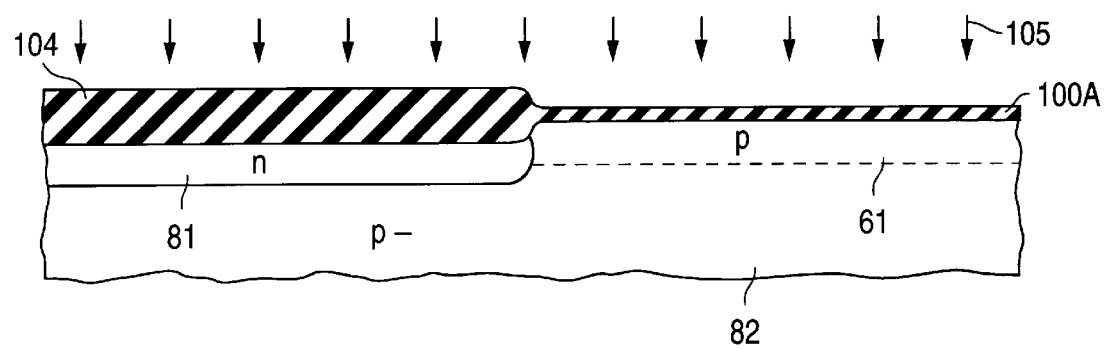
Figure 12E:
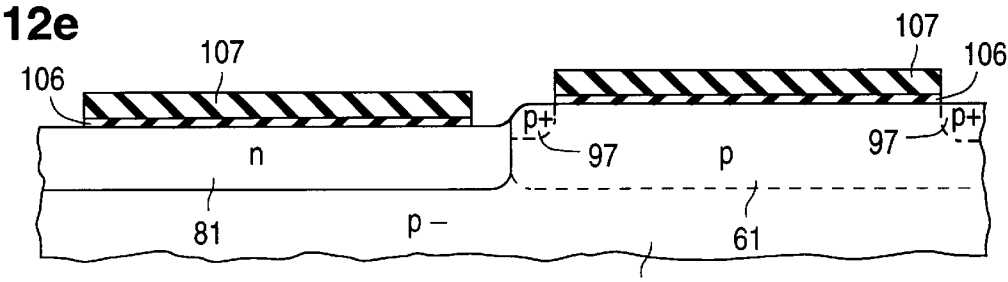
Figure 12F:
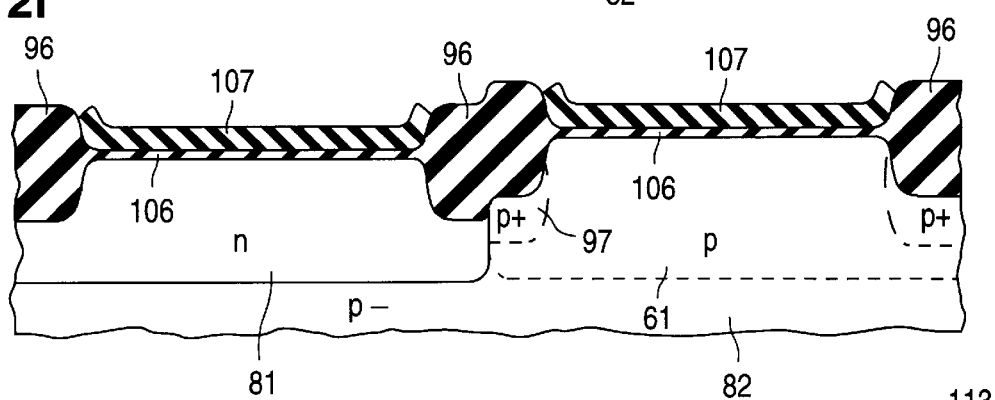
Figure 12G:
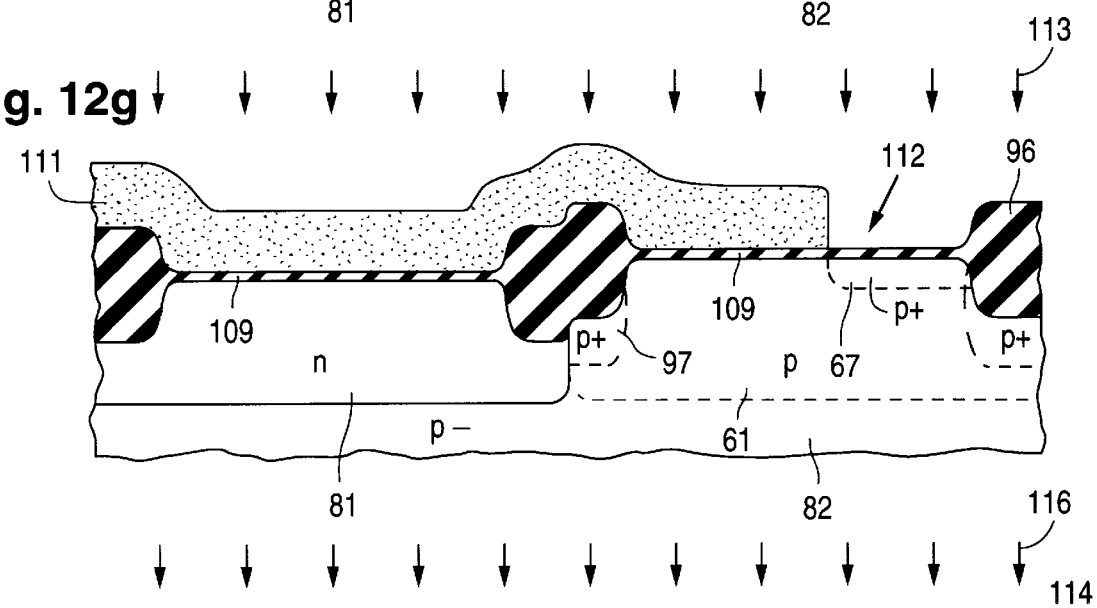
Figure 12H:
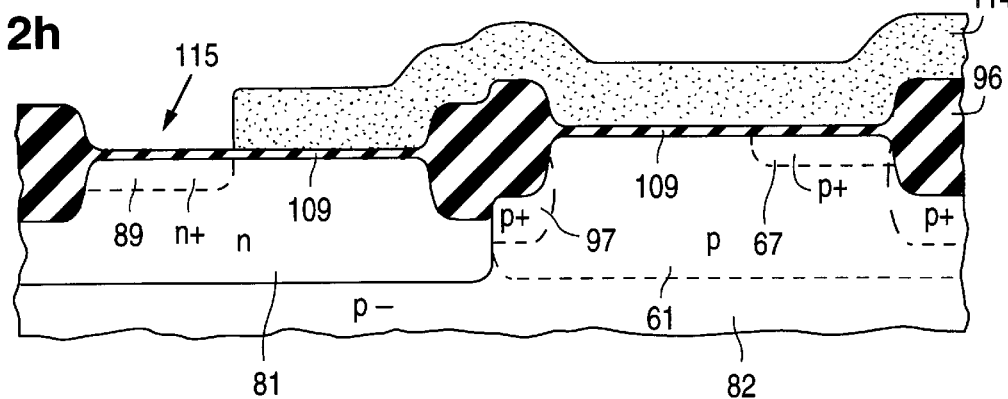
Figure 12L:
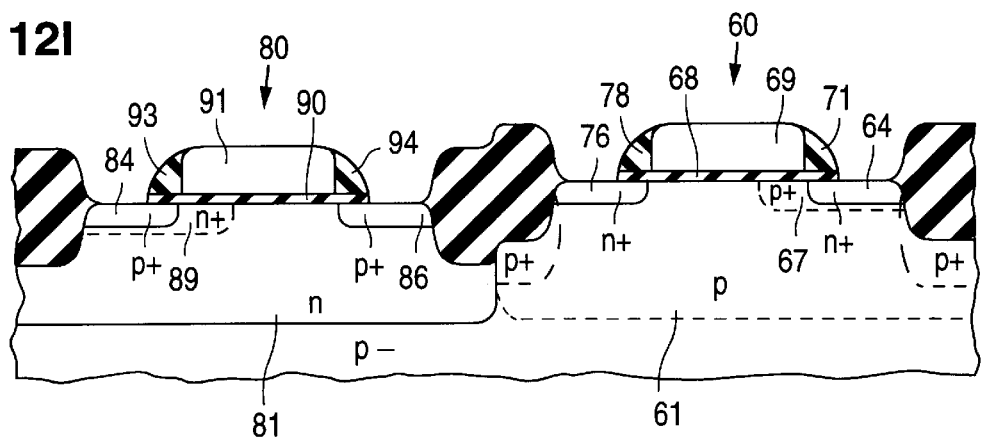
Figure 12M:
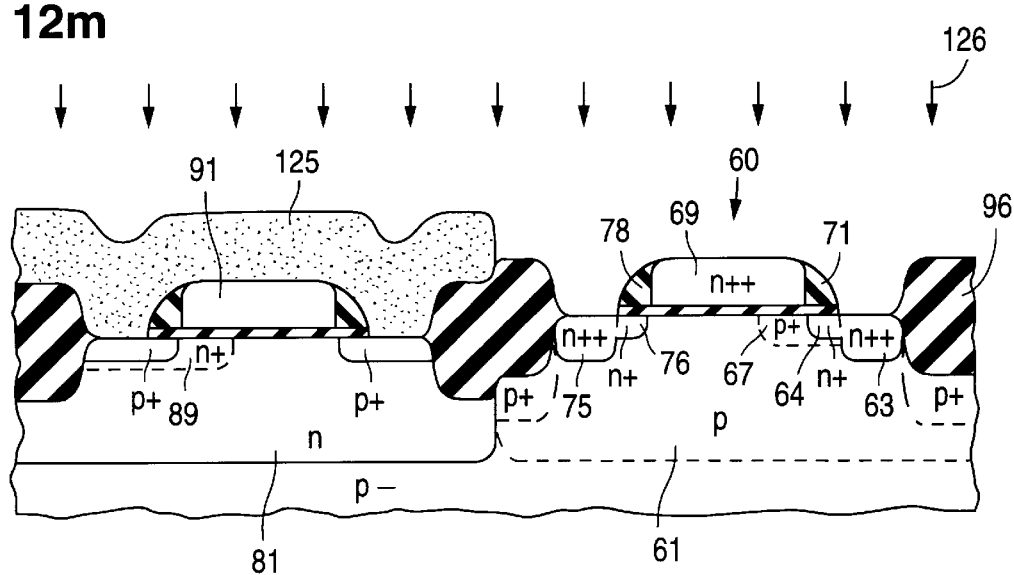
Figure 12N:
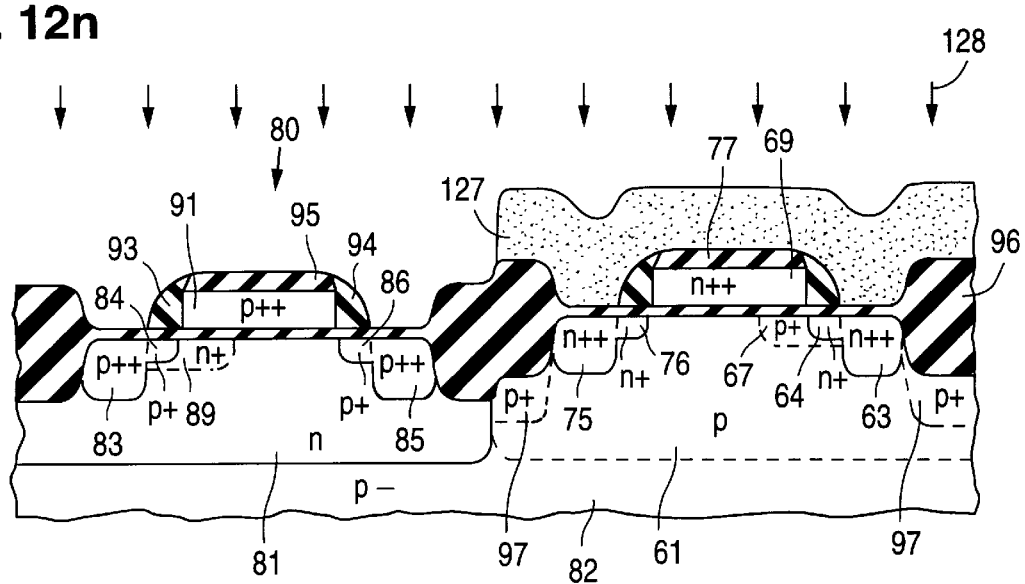

FIGS. 12a–12n (collectively "FIG. 12") illustrate a VLSI process for manufacturing the CMOS structure of FIG. 10 according to the invention. The fabrication process of FIG. 12 is designed to provide FETs 60 and 80 with gate lengths of approximately 2 μm in a scaled CMOS (or BiCMOS) process having a minimum feature size of 0.7 μm. In addition, the process is arranged so that complementary minimum-size threshold-adjusted LDD insulated-gate FETs having gate lengths of the minimum feature size are fabricated simultaneously with FETs 60 and 80 at other locations (not shown here) in the structure by appropriately adjusting (a) the gate lengths and (b) the implant masks used in forming threshold body regions 67 and 89.

The starting point is a semiconductor wafer consisting of a (100) heavily doped p-type monosilicon semiconductive substrate (not shown) over which p region 82 is formed as an epitaxial layer. The p+ substrate has a uniform dopant concentration of $8 \times 10^{17} – 2 \times 10^{19}$ atoms/cm$^3$ (corresponding to a resistivity of 0.05–0.005 ohm-cm). The dopant concentration of p-epitaxial layer 82 is $3.3 \times 10^{14} – 6.7 \times 10^{14}$ atoms/cm$^3$ (corresponding to a resistivity of 40–20 ohm-cm). Epitaxial layer 82 has a thickness of 4–7 μm.

A pad layer 100 of silicon oxide is thermally grown along the upper surface of epitaxial layer 82. See FIG. 12a. A layer 101 of silicon nitride is deposited on pad oxide 100.

Using a photoresist mask 102, a portion of nitride layer 101 is removed above the location for n device region 81 as shown in FIG. 12b. Phosphorus ions 103 are implanted through the exposed part of pad oxide 100 and into epitaxial layer 82 to define n device region 81 from which long-gate p-channel FET 80 is to be is created. The phosphorus implant energy and dose are chosen such that the net dopant concentration at the upper surface of device region 81 is in the vicinity of $5 \times 10^{16}$ atoms/cm$^3$ at the end of the fabrication process.

Phosphorus ions 103 may be simultaneously implanted through a separate opening (not shown) in photoresist mask 102 to define another n device region (not shown) from which a p-channel FET of minimum gate length ("short-gate p-channel FET") is to be formed in an LDD configuration. Alternatively, a short-gate p-channel FET is created in an LDD configuration from another part (not shown) of n device region 81. In either case, photoresist mask 102 is removed after the phosphorus implant.

In FIG. 12c, a relatively thick layer 104 of silicon oxide is thermally grown along the portion of the upper silicon surface not covered by the remainder 101A of nitride 101. Nitride layer 101A prevents silicon oxide from growing under nitride 101A. Device region 81 is thermally driven (diffused) further into epitaxial layer 82 during this step, and the implanted phosphorus is activated, thereby providing the main body region for p-channel FET 80. The same occurs with any other n device region formed in epitaxial layer 82.

Nitride layer 101A is removed as indicated in FIG. 12d. Boron ions 105 are implanted through the remainder 100A of pad oxide 100 and into the underlying part of epitaxial layer 82 to define p device region 61 from which long-gate n-channel FET 60 is to be created. The boron implant energy and dose are chosen such that the net dopant concentration at the upper surface of device region 61 is in the vicinity of $5 \times 10^{16}$ atoms/cm$^3$ at the end of the fabrication process.

Boron ions 105 may be simultaneously implanted through a separate part (not shown) of remaining pad oxide 100A to define another p device region from which an n-channel FET of minimum channel length ("short-gate n-channel FET") is to be formed in an LDD configuration. Alternatively, a short-gate n-channel FET is created in an LDD configuration from another part of p device region 61. Thick oxide layer 104 prevents boron ions 105 from being implanted into n device region 81 and any other such n device region.

Thick oxide 104 and pad oxide 100A are stripped as indicated in FIG. 12e. A new layer 106 of silicon oxide is thermally grown along the upper surface of the exposed silicon. A layer 107 of silicon nitride is deposited over oxide layer 106. Nitride layer 107 and oxide layer 106 are patterned using conventional photolithographic techniques to expose parts of n device region 81 and p device region 61. Parts of any other n device region and any other p device region are similarly exposed. Using a photoresist mask (not shown) that covers n device region 81 and any other n device region, boron ions are implanted into p device region 61 and into any other p device region to form self-aligned p+ channel-stop region 97.

In FIG. 12f, field oxide 96 is thermally grown along the exposed part of the upper silicon surface. The implanted phosphorus and boron are driven deeper into epitaxial layer 82 during this step. Device regions 61 and 81, along with any other p and/or n device regions, thereby expand downward. The implanted boron that defines p device region 61 is activated so as to provide the main body region for n-channel FET 60. At the end of the fabrication process, main body regions 61 and 81 each extend 0.7–2.0 μm into epitaxial layer 82.

Nitride 107 and oxide 106 are removed. See FIG. 12g. A sacrificial layer 109 of silicon oxide is thermally grown along the exposed silicon at the top of the wafer. The structure is now ready for local threshold-adjust dopings to form threshold body regions 67 and 89 and thus threshold channel portions 66 and 88.

A critical photoresist mask 111 is formed on top of the structure as shown in FIG. 12g. Photoresist mask 111 covers (a) n device region 81 where p-channel FET 80 is being formed and (b) part of p device region 61 where n-channel FET 60 is being formed. Mask 111 has an opening 112 generally above the intended location for p threshold body region 67 and n-type source zone 63/64. In FIG. 12g, opening 112 typically extends 0.5 μm to the left of the intended location for source zone 63/64.

Photoresist mask ill has additional open space (which may be part of, or separate from, opening 112) above the intended location for the source, drain, and intervening channel of the short-gate n-channel FET in the other p device region or in the other part of p device region 61. Mask 111 covers the entire wafer portion above the intended location for the source, drain, and intervening channel of the short-gate p-channel FET in the other n device region or in the other part of n device region 81.

A local threshold implant is performed for long-gate n-channel FET 60 by implanting boron ions 113 into p device region 61 through the part of oxide layer 109 exposed by opening 112 to define p+ threshold body region 67. The mean depth of the boron implant is largely constant across the lateral extent of threshold body region 67. The boron implant energy and dose are chosen such that, at the end of the fabrication process, the net dopant concentration of region 67 at the upper semiconductor surface falls into the range given above for threshold channel portion 66. That is, threshold body region 67 reaches a final net surface dopant concentration of $3 \times 10^{16} – 3 \times 10^{17}$ atoms/cm$^3$, typically $1.3 \times 10^{17}$ atoms/cm$^3$.

Boron ions 113 are simultaneously blanket implanted through the additional open space in photoresist mask 111 into a surface portion of all of the other p device region or all of the other part of p device region 61 to adjust the threshold voltage of the short-gate n-channel FET. Consequently, the threshold-adjust doping in the short-gate n-channel FET extends across the entire channel zone. The short-gate n-channel FET has approximately the same adjusted threshold voltage as long-gate n-channel FET 60.

After removing mask 111, another critical photoresist mask 114 is formed on top of the structure. See FIG. 12h. Photoresist mask 114 covers (a) device region 61 where n-channel FET 60 is being formed and (b) part of device region 81 where p-channel FET 80 is being formed. Mask 114 has an opening 115 generally above the intended location for n+ threshold body region 89 and p-type source zone 83/84. In FIG. 12h, opening 115 typically extends 0.5 μm to the right of the intended location for source zone 83/84.

Photoresist mask 114 has additional open space (which may be part of, or separate from, opening 115) above the intended location for the source, drain, and intervening channel of the short-gate p-channel FET in the other n device region or in the other part of n device region 81. Mask 114 covers the entire wafer portion above the intended location for the source, drain, and intervening channel of the short-gate n-channel FET in the other p device region or in the other part of p device region 61.

A local threshold implant is performed for long-gate p-channel FET 80 by implanting arsenic ions 116 into n device region 81 through the part of oxide layer 109 exposed by opening 115 to define n+ threshold body region 89. The mean depth of the arsenic implant is largely constant across the lateral extent of threshold body region 89. The arsenic implant energy and dose are chosen such that the net dopant concentration of region 89 is $3 \times 10^{16} - 3 \times 10^{17}$ atoms/cm$^3$, typically $1.3 \times 10^{17}$ atoms/cm$^3$, at the end of the fabrication process.

Arsenic ions 116 are simultaneously blanket implanted through the additional open space in photoresist mask 114 into a surface portion of all of the other n device region or all of the other part of n device region 81 to adjust the threshold voltage of the short-gate p-channel FET. As with the short-gate n-channel FET, the threshold-adjust doping in the short-gate p-channel FET thereby extends across its entire channel zone. Similarly, the short-gate p-channel FET has approximately the same adjusted threshold voltage as long-gate p-channel FET 80. Photoresist mask 114 and oxide layer 109 are removed to complete the threshold implant steps.

A gate dielectric layer 118 of silicon oxide is thermally grown along the exposed monosilicon. A layer of polysilicon is deposited on top of the wafer. The polysilicon is masked (not shown) and etched to form polysilicon gate electrodes 69 and 91 having lengths of approximately 2 μm. Polysilicon gate electrodes (not shown) having lengths approximately equal to the minimum feature size of 0.7 μm are simultaneously created over parts of the wafer areas for the short-gate n-channel and p-channel FETs. Thin sealing layers 119 of silicon oxide are thermally grown over gate electrodes 69 and 91 and the other gate electrodes. FIG. 12i illustrates the structure at this point.

In FIG. 12j, a non-critical photoresist mask 121 is formed over the wafer so as to expose the location for p-channel FET 80 and to cover the location for n-channel FET 60. Photoresist mask 121 similarly exposes the location for the short-gate p-channel FET while covering the location for the short-gate n-channel FET.

Using the combination of photoresist 121, field oxide 96, gate electrode 91, and the portions of sealing oxide 119 along the sides of electrode 91 as an implant shield, boron ions 122 are implanted through gate oxide 118 into the unshielded portions of device region 81 to define precursor p+ extensions 84 and 86 for the source and drain of FET 80. The boron implant energy and dose are chosen such that the net dopant concentration of p+ extensions 84 and 86 along the upper semiconductor surface is $3 \times 10^{17} - 3 \times 10^{18}$ atoms/cm$^3$, typically $1 \times 10^{18}$ atoms/cm$^3$, at the end of the fabrication process.

Boron ions 122 are simultaneously implanted in the same manner into the other n device region or into the other part of n device region 81 to define a pair of laterally separated p+ extensions (not shown) for the source and drain of the short-gate p-channel FET. The threshold-adjusted channel of the short-gate p-channel FET extends between these two p+ extensions. Mask 121 is subsequently removed.

Another non-critical photoresist mask 123 is formed over the wafer so as to expose the location for n-channel FET 60 and to cover the location for p-channel FET 80. See FIG. 12k. Photoresist mask 123 also exposes the location for the short-gate n-channel FET while covering the location for the short-gate p-channel FET.

Using the combination of photoresist 123, field oxide 96, gate electrode 69, and the portions of oxide 119 along the sides of electrode 69 as an implant shield, phosphorus ions 124 are implanted through gate oxide 118 into the unshielded portions of p device region 61 to define precursor n+ extensions 64 and 76 for the source and drain of n-channel FET 60. The phosphorus implant and dose are chosen such that, at the end of the fabrication process, the net dopant concentration of n+ extensions 64 and 76 falls into the range given above for source extension 64. That is, extensions 64 and 76 reach a final net surface dopant concentration of $3 \times 10^{17} - 3 \times 10^{18}$ atoms/cm$^3$, typically $\times 10^{18}$ atoms/cm$^3$.

Phosphorus ions 124 are simultaneously implanted in a similar manner into the other p device region or into the other part of p device region 61 to define a pair of laterally separated n+ extensions (not shown) for the source and drain of the short-gate n-channel FET. The threshold-adjusted channel of the short-gate n-channel FET extends between these two n+ extensions.

After removing photoresist mask 123, a layer of low-temperature oxide is conformally deposited on top of the structure. The low-temperature oxide is anisotropically etched to form oxide sidewall spacers 71 and 78 along the source and drain sides of gate electrode 69. Oxide sidewalls spacers 93 and 94 are simultaneously formed along the source and drain sides of gate electrode 91. Oxide sidewall spacers (not shown) are also simultaneously formed along the source and drain sides of the gate electrodes for the short-gate FETs. Spacers 71, 78, 93, and 94 and the other sidewall spacers are considerably thicker (in the lateral direction) than sealing oxide 119. FIG. 12l shows the structure at this stage. The remainder of gate oxide 118 constitutes gate dielectric layers 68 and 90, along with gate dielectric layers (not shown) for the short-gate FETs.

A non-critical photoresist mask 125 is formed over the structure so as to expose n-channel FET 60 while covering p-channel FET 80. See FIG. 12m. Photoresist mask 125 similarly exposes the short-gate n-channel FET and covers the short-gate p-channel FET.

Using the combination of photoresist 125, field oxide 96, gate electrode 69, and spacers 71 and 78 as an implant shield, arsenic ions 126 are implanted at a high-dosage into the exposed areas of p device region 61 to define n++ main portions 63 and 75 for the source and drain of FET 60. The arsenic implant energy and dose are chosen such that, at the end of the fabrication process, the net dopant concentration of n++ main portions 63 and 65 falls into the range given above for main source portion 63. That is, main portions 63 and 65 reach a final net surface dopant concentration of $3 \times 10^{19}$–$3 \times 10^{20}$ atoms/cm$^3$, typically $1 \times 10^{20}$ atoms/cm$^3$.

Arsenic ions 126 are simultaneously implanted in the same manner into the other p device region or into the other part of p device region 61 to define a pair of laterally separated n++ main portions (not shown) for the source and drain of the short-gate n-channel FET. Gate electrode 69 and the gate electrode for the short-gate n-channel FET are also doped heavily n-type during the arsenic implantation.

After removing photoresist mask 125, thin sealing layers of silicon oxide are thermally grown along the upper surfaces of the exposed silicon areas. Sealing oxide layers 77 and 95 are thereby formed along the tops of polysilicon gate electrodes 69 and 91 as indicated in FIG. 12n. Sealing oxide layers (not shown) are simultaneously formed along the tops of the polysilicon gate electrodes for the short-gate FETs.

A non-critical photoresist mask 127 is formed over n-channel FET 60, leaving p-channel FET 80 exposed. Photoresist mask 127 likewise exposes the short-gate p-channel FET and covers the short-gate n-channel FET.

Using the combination of photoresist 127, field oxide 96, gate electrode 91, and spacers 93 and 94 as an implant shield, boron ions 128 are implanted through the sealing oxide into the unshielded portions of n device region 81 at a high dosage to define p++ main portions 83 and 85 for the source and drain of FET 80. The boron implant energy and dose are chosen such that the net dopant concentration of p++ main portions 83 and 85 along the upper semiconductor surface is $3 \times 10^{19}$–$3 \times 10^{20}$ atoms/cm$^3$, typically $1 \times 10^{20}$ atoms/cm$^3$, at the end of the fabrication process.

Boron ions 128 are simultaneously implanted in the same manner into the other n device region or into the other part of n device region 81 to define a pair of laterally separated p++ main portions for the source and drain of the short-gate p-channel FET. Gate electrode 91 and the gate electrode for the short-gate p-channel FET are also doped heavily p-type during this boron implantation.

In completing the fabrication of the CMOS structure, photoresist mask 127 is removed. The resulting structure for LDD long-gate FETs 60 and 80 is basically that of FIG. 10a. Examples of the complementary LDD short-gate FETs are illustrated in FIGS. 13 and 14 described below.

A layer of low-temperature oxide (not shown) is deposited on top of the structure and reflowed to planarize the upper dielectric surface. During the reflow, zones 63, 64, 67, 75, 76, 83–86, and 89 expand to the positions shown in FIG. 10a. The various parts of the sources and drains for the short-gate FETs likewise expand largely to their final positions during the low-temperature oxide reflow. All non-activated p-type and n-type dopants become activated. In this way, threshold channel portions 66 and 88 are produced for long-gate FETs 60 and 80 while threshold-adjust dopings are concurrently provided across the entire channels of the two short-gate FETs. Metallization (not shown) and passivation (also not shown) are performed after the reflow.

The numerical values of the parameters that characterize the process of FIG. 10 apply to the exemplary minimum feature size and gate length of 0.7 μm. The exemplary process used to fabricate FETs 60 and 80 can be readily scaled downward (or upward) to other minimum feature sizes. The numerical values of the process parameters, including dimensions, are then scaled appropriately.

Figure 13:
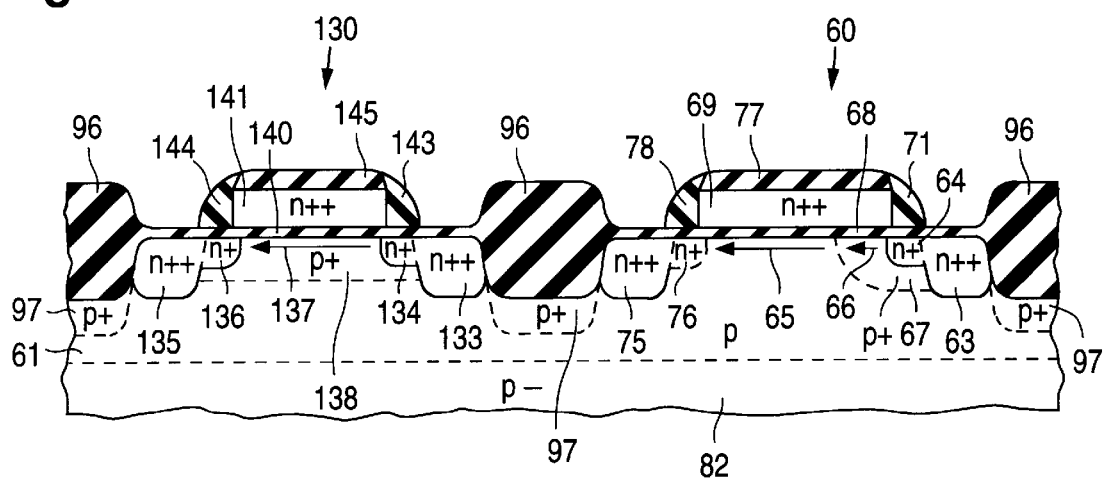
FIG. 13 is a cross-sectional view of (a) a long-gate n-channel insulated-gate FET provided with local threshold-adjust doping in accordance with the invention and (b) an n-channel insulated-gate FET of minimum gate length.
Figure 14:
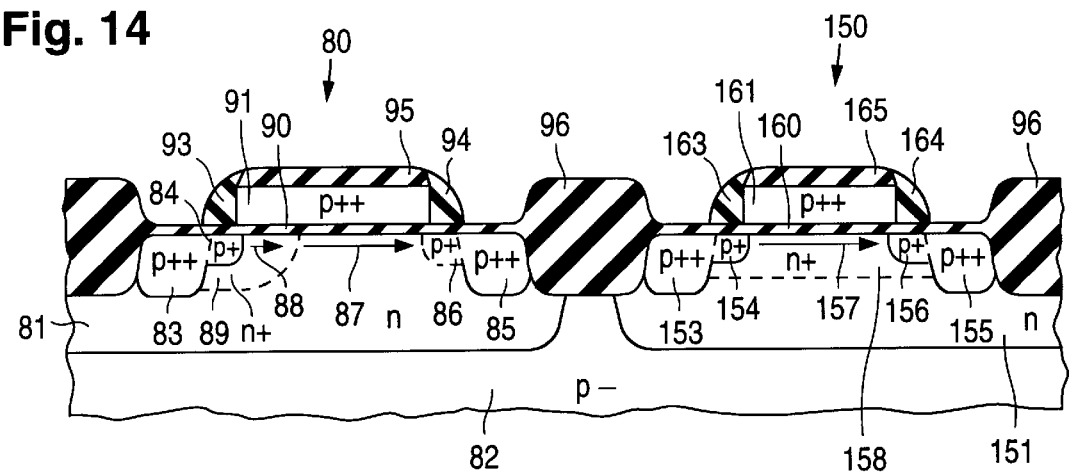
FIG. 14 is a cross-sectional view of (a) a long-gate p-channel insulated-gate FET provided with local threshold-adjust doping in accordance with the invention and (b) a p-channel insulated-gate FET of minimum gate length.

FIG. 13 depicts an example in which an enhancement-mode LDD n-channel insulated-gate FET 130 of minimum gate length is created from p device region 61 utilized for long-gate n-channel FET 60. Short-gate n-channel FET 130 has (a) a source zone formed with n++ main portion 133 and more lightly doped n+ extension 134 and (b) a drain zone formed with n++ main portion 135 and more lightly doped n+ extension 136. In p device region 61, n+ drain extension 136 is laterally separated from n+ source extension 134 by surface channel zone 137 situated in p+ threshold body region 138 which extends between the source and drain zones of n-channel FET 130.

Silicon-oxide gate dielectric layer 140 vertically separates n++ polysilicon gate electrode 141 from globally threshold-adjusted channel zone 137 in short-gate n-channel FET 130. The length of polysilicon gate electrode 141, measured horizontally in FIG. 13, is approximately 0.7 μm, the minimum feature size here. Silicon-oxide dielectric spacers 143 and 144, which are used in defining n++ main source drain portions 133 and 135, are situated along the source and drain sides of gate electrode 141. Silicon-oxide sealing layer 145 is provided along the top of electrode 141.

FIG. 14 illustrates an example in which an enhancement-mode LDD p-channel insulated-gate FET 150 of minimum gate length is created from an n device region 151 formed in p- epitaxial layer 82. Field oxide 96 and part of epitaxial layer 82 laterally separate n device region 151 from n device region 81 employed for p-channel FET 80. Short-gate p-channel FET 150 has (a) a source zone formed with p++ main portion 153 and more lightly doped p+ extension 154 and (b) a drain zone formed with p++ main portion 135 and more lightly doped p+ extension 156. In n device region 151, p+ drain extension 156 is laterally separated from p+ source extension 154 by surface channel zone 157 situated in an n+ threshold body region 158 which extends between the source and drain zones of p-channel FET 150.

Silicon-oxide gate dielectric layer 160 vertically separate p++ polysilicon gate electrode 161 from globally threshold-adjusted channel zone 157 in short-gate p-channel FET 150. As with gate electrode 141 in n-channel FET 130, the length of polysilicon gate electrode 161 in p-channel FET 150, measured horizontally in FIG. 14, is approximately 0.7 μm. Silicon-oxide dielectric spacers 163 and 164, which are employed in defining n++ main source/drain portions 153 and 155, are situated along the source and drain sides of gate electrode 141. Silicon-oxide sealing layer 165 lies along the top of electrode 161.

For an LDD insulated-gate FET, the channel length $L_c$ is determined from the gate length L according to the approximate relationship:

$$L_c = L - 1.5 d_{JLDD} \quad (10)$$

where $d_{JLDD}$ is the depth of the (lightly doped) source/drain extensions. For the typical numerical parameters given for the FETs in FIGS. 10–14, $d_{JLDD}$ is approximately 0.2 μm. Accordingly, channel length L for long-gate FETs 60 and 80 of 2-μm gate length is approximately 1.7 μm. For the 0.7-μm minimum gate length, short-gate FETs 130 and 150 have the minimum manufacturable channel length of approximately 0.4 μm.

Computer simulations have been performed on LDD long-gate n-channel insulated-gate FETs provided with the local threshold-adjust doping of the invention. The device parameters, such as gate dielectric thicknesses, source/drain, including LDD) dopant profiles, and the threshold-voltage values, of the simulated FETs apply to a typical scaled fabrication process of 0.7-μm minimum feature size. The computer simulations fully confirm the performance results presented above.

Figure 4:
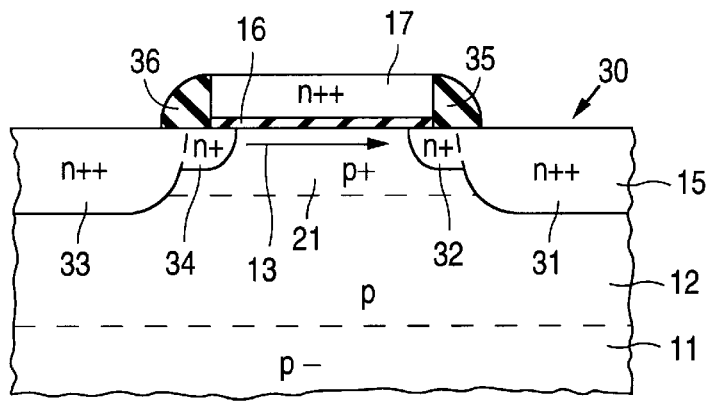
FIG. 4 is a cross-sectional view of a conventional LDD n-channel insulated-gate FET.
Figure 5:
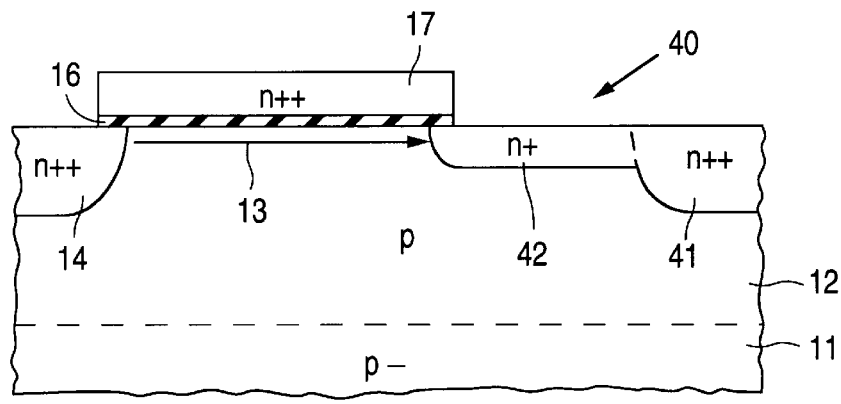
FIG. 5 is a cross-sectional view of a conventional extended-drain LDD n-channel insulated-gate FET.
Figure 6:
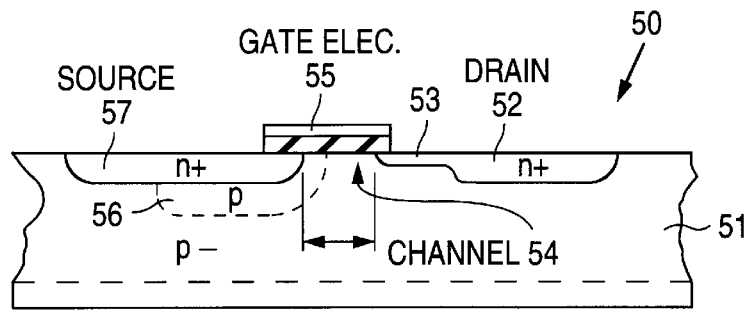
FIG. 6 is a cross-sectional view of a conventional discrete high-voltage n-channel MOS transistor having a lightly doped n-type drain extension and a local p-type body region doped more heavily than the p-type substrate.

The gate length utilized in simulating the long-gate n-channel FETs of the invention was 2 μm. For comparison purposes, simulations were conducted on a reference LDD n-channel insulated-gate FET having the same gate length (2 μm) as the long-gate n-channel FET of the invention but provided with a global threshold-adjust doping rather than a local threshold-adjust doping. This long-gate n-channel reference transistor basically constituted a long-channel implementation of LDD FET 30 in FIG. 4. For additional comparison purposes, simulations were also performed on a reference LDD n-channel insulated-gate FET of minimum gate length, 0.7 μm here. The reference short-gate FET basically constituted a minimum-gate-length implementation of LDD FET 30.

The computer simulations were conducted with the Medici Two-Dimensional Semiconductor Device Simulation Program, vols. 1 and 2, available from Technology Modeling Associates. The simulations extended to a depth of 5 μm. This is sufficient for describing device operation up to and including the drain breakdown voltage.

The threshold-adjust doping, applied locally in the long-gate n-channel FET of the invention and globally in the reference n-channel FETs, was assumed to have a Gaussian vertical profile with the maximum dopant concentration at the upper semiconductor surface. The vertical dopant profile for both the main portions and the more lightly doped extensions of the source/drain zones was likewise assumed to be Gaussian with the maximum dopant concentration at the upper surface. The p well corresponding (a) to device region 61 for the long-gate n-channel FET of the invention and (b) to well 21 for the long-gate and short-gate n-channel reference FETs (FIG. 4) had a Gaussian vertical dopant profile with the maximum dopant concentration occurring at the upper semiconductor surface. The underlying semiconductor material was assumed to be uniformly doped.

The Medici enhanced surface mobility model SRFMOB2 was used in conjunction with the concentration-dependent mobility model CONMOB at low electric fields and in conjunction with the field-dependent mobility model FLDMOB at high electric fields. The concentration-dependent recombination law was used in the simulations. The impact ionization generation was turned on in all the simulations, along with the band-to-band tunneling. Several verification runs indicated that the presence/absence of band-to-band tunneling does not lead to any significant performance differences for the range of parametric values considered.

The grids of all the FET structures were designed manually for accurate descriptions of the regions of important electronic activity. Each grid had 2,500–5,000 nodes. The two-carrier simulation mode was utilized in all the simulations, with a single automatic regridding on doping. The physical reality of the simulations was checked at regular voltage stepping intervals using a three-dimensional plotting of potential distribution.

The primary value for the length $L_T$ of the gate portion corresponding vertically to the threshold channel portion examined in simulations of the present long-gate n-channel FET was approximately 0.5 μm. For convenience, length $L_T$ is referred to here as the threshold gate length. In FIGS. 12g and 12i, threshold gate length $L_T$ is the length of the portion of opening 112 overlying the location for gate electrode 69—i.e., the distance from the left-hand edge of photoresist mask 112 to the right-hand edge of electrode 69. Inasmuch as the length L of the gate electrode in the long-gate n-channel FET examined in the simulations was 2 μm, the gate portion corresponding vertically to the main channel portion had a length $L_M$ of approximately 1.5 μm. In some of the simulations, threshold gate length $L_T$ varied from a value just above zero to a value just below the 2-μm gate length of the long-gate n-channel FETs in the simulations.

Except as mentioned above and specified below, the values of the parameters that defined the reference long-gate and short-gate n-channel FETs in the simulations were respectively the same as the values of the parameters that defined the long-gate n-channel FET of the invention. The following numerical values were used in the simulations:

threshold-adjust dopant concentration at upper surface= $1.3 \times 10^{17}$ atoms/cm$^3$, depth of threshold-adjust doping (to location at which additional dopant concentration provided by threshold-adjust doping approximately equals p-well dopant concentration)=0.3 μm, p-well dopant concentration at upper surface=$5 \times 10^{16}$ atoms/cm$^3$, p-well depth (to location at which additional dopant concentration provided by p-well doping approximately equals background dopant concentration)=1.5 μm, dopant concentration of LDD source/drain extensions at upper surface=$1 \times 10^{18}$ atoms/cm$^3$, depth of LDD source/drain extensions=0.2 μm, dopant concentration of main source/drain portions at upper surface=$1 \times 10^{20}$ atoms/cm$^3$, depth of source/drain pn junctions=0.2 μm (to one-figure accuracy but actually slightly greater than depth of LDD source/drain extensions), background dopant concentration of semiconductive material below p well=$5 \times 10^{14}$ atoms/cm$^3$, source/drain (FET) width=0.5 μm, rotation coefficient for Gaussian dopant profiles=0.75, interface fixed charge density=$1 \times 10^{10}$ elementary charges/cm$^2$, recombination-generation lifetime at low dopant concentration=0.1 μs for both electrons and holes, and Medici parameter $N_{SRHN}$ in the concentration-dependent recombination law=$4 \times 10^{17}$ atoms/cm$^3$. All other material parameters were set at their Medici default values.

FIG. 15.1 illustrates a three-dimensional computer representation for the dopant concentration profile of locally threshold-adjusted long-gate n-channel FET 60 having total gate length L of approximately 2 μm and threshold gate length $L_T$ of approximately 0.5 μm ("2-μm/0.5-μm n-channel FET 60"). FIG. 15.2 illustrates a corresponding three-dimensional computer representation for the dopant concentration profile of the globally threshold-adjusted long-gate (2-μm) n-channel reference FET.

A two-dimensional computer representation of the dopant concentration profile along the upper semiconductor surface of 2-μm/0.5-μm n-channel FET 60 in the direction of its channel length is illustrated in FIG. 16.1. Item M indicates the area where the dopant concentration of main channel portion 65 is flat (constant). Item T indicates the area where the dopant concentration of threshold channel portion 66 is flat.

FIG. 16.2 presents a two-dimensional computer representation of the vertical dopant profiles through main body region 61 and threshold body region 67 of 2-μm/0.5-μm n-channel FET 60. In particular, the dopant profiles for body regions 61 and 67 in FIG. 16.2 are respectively taken through areas M and T in FIG. 16.1.

Threshold-voltage simulations were performed on locally threshold-adjusted n-channel FETs of the invention to determine their threshold voltages and to assess how threshold voltage $V_T$ varies with threshold gate length $L_T$. FIG. 17.1 depicts how drain current $I_D$ per unit source/drain width varies with gate voltage $V_G$ at drain voltage $V_D$ of 0.1 V in simulations of long-gate n-channel FETs having total gate length L of 2 μm. In all the simulations involving gate voltage $V_G$ and drain voltage $V_D$, source voltage $V_S$ is zero so that gate-to-source voltage $V_{GS}$ and drain-to-source voltage $V_{DS}$ respectively equal gate voltage $V_G$ and drain voltage $V_D$. Drain current $I_D$ is presented on a linear scale in FIG. 17.1. In FIG. 17.2, current $I_D$ is presented on a logarithmic scale.

The simulations of FIGS. 17.1 and 17.2 (collectively "FIG. 17") were done for various values of threshold gate length $L_T$ in the range of 0–2 μm. The $I_D$-$V_G$ curve for the zero threshold channel length represents an n-channel FET having essentially no (local or global) threshold-adjust implant. The $I_D$-$V_G$ curve for the 2-μm threshold gate length represent the long-gate n-channel reference FET having a global threshold-adjust doping. The other $I_D$-$V_G$ curves in FIG. 17 represent various implementations of local threshold-adjusted n-channel FET 60 at different values of threshold gate length $L_T$. The $I_D$-$V_G$ curve for 2-μm/0.5-μm long n-channel FET 60 is marked with circles in FIG. 17.

Threshold voltage $V_T$ in FIG. 17.1 is determined by extrapolating the maximum-slope portion of each $I_D$-$V_G$ curve down to zero gate voltage. This yields $V_T$ values ranging from 0.3 V for the long-gate n-channel FET having no threshold-adjust doping to 0.7 V for the long-gate n-channel reference FET having a global threshold-adjust doping. Each of the long-gate n-channel FETs of the invention had a $V_T$ value between these two extreme values with threshold voltage $V_T$ increasing as threshold channel length $L_T$ increases. As indicated by the $V_T$ line in FIG. 17.1, 2-μm/0.5-μm n-channel FET 60 had a threshold voltage of approximately 0.65 V.

Importantly, threshold voltage $V_T$ varies greatly with threshold gate length $L_T$ as length $L_T$ increases from zero toward a value in the vicinity of 0.5 μm. For length $L_T$ greater than 0.5 μm, threshold voltage $V_T$ varies weakly with increasing $L_T$. This is consistent with the modeling of the invention in that only a small portion, normally less than a given minimum $L_T$ value, of the channel zone needs to be non-conductive in order to turn off the entire FET. The minimum value of threshold gate length $L_T$ is expected to be in the vicinity of the minimum manufacturable channel length of the short-gate n-channel FET having a global threshold-adjust doping. Specifically, a safe value for the minimum threshold gate length $L_T$ is approximately 75% of the minimum feature size of the fabrication process used to manufacture both the long-gate and short-gate FETs.

The logarithmic $I_D$ scale in FIG. 17.2 was used to extract the $V_T$ values with greater accuracy. In FIG. 17.2, threshold voltage $V_T$ is determined as the $V_G$ value at which drain current $I_D$ equals $2 \times 10^{-7}$ A/μm. The $V_T$ values determined according to this method were very close to those determined by the extrapolation technique of FIG. 17.1.

Figure 18:
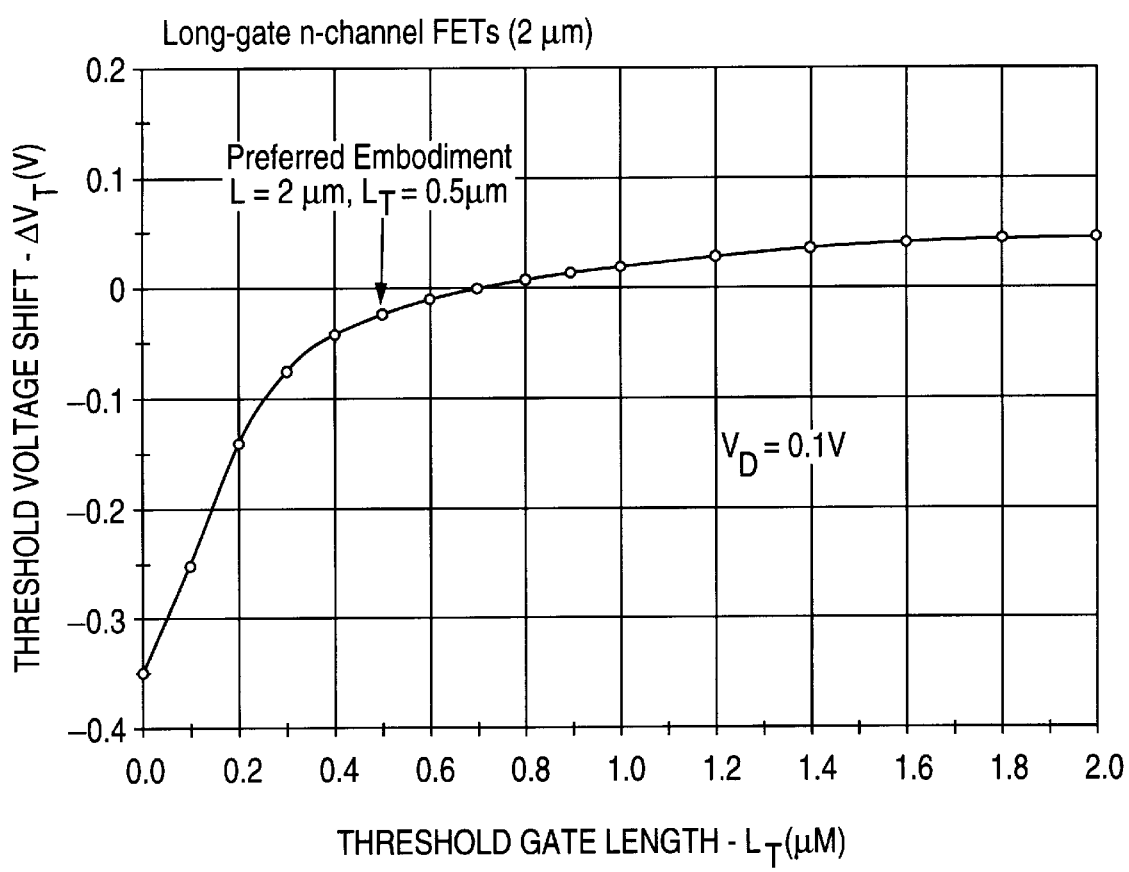
FIG. 18 is a graph of threshold voltage change as a function of the gate length portion corresponding to the threshold channel length for implementations of the n-channel FET of FIG. 10 examined in computer simulations.

In FIG. 18, the $V_T$ data of FIG. 17 is plotted in the form of the threshold shift $\Delta V_T$ as a function of threshold gate length $L_T$. FIG. 18 also contains some $V_T$ sample points not shown in FIG. 17. The chosen baseline point, at which threshold shift $\Delta V_T$ equals zero in FIG. 18, is an $L_T$ value of 0.7 μm.

As FIG. 18 shows, threshold shift $\Delta V_T$ increases sharply with increasing threshold gate length $L_T$ from zero to approximately 0.3–0.4 μm where the $\Delta V_T$-$L_T$ curves bend. Beyond the bend in the $\Delta V_T$-$L_T$ curves, threshold shift $\Delta V_T$ increases slowly with increasing length $L_T$.

In fabricating the long-gate FETs of the invention, there is invariably a small alignment error in the location of the mask edge (e.g., the right-hand edge of photoresist mask 111 in FIG. 12g) which determines the value of threshold gate length $L_T$. Assume that the alignment error equals ±0.1 μm. If the nominal value of threshold gate length $L_T$ for the fabrication process were near the middle of the steep portion of the $\Delta V_T$-$L_T$ curve in FIG. 18 where $L_T$ is approximately 0.2 μm, the presence of a ±0.1-μm alignment error would result in a relatively large $V_T$ difference of approximately 0.2 V for FETs at the extreme values of the alignment error.

On the other hand, by choosing the nominal threshold gate length $L_T$ at a value just beyond the bend in the $\Delta V_T$-$L_T$ curve, the $V_T$ difference for FETs at extreme values of the ±0.1-μm alignment error is quite small. For example, at the nominal $L_T$ of 0.5 μm where threshold voltage $V_T$ equals 0.65 V, the difference in voltage $V_T$ for FETs at the extreme values of the alignment error is only 0.03 V. This is sufficiently small as to be generally tolerable in a production integrated-circuit fabrication process.

From the manufacturability point of view, the minimum value of threshold gate length $L_T$ is determined by the registration alignment (i.e., misalignment) of the photolithographic equipment used to determine the right-hand edge of mask 111 in FIG. 12g rather than by the minimum feature size of the FET fabrication process. As indicated above, the minimum feature size is usually several times the maximum mask registration misalignment. If a $V_T$ variation of, for example, 0.1 V, can be tolerated, the threshold voltage can be reduced by choosing a nominal $V_T$ value to the left of the preferred nominal value in FIG. 18. The long-gate n-channel FET of the invention than has a lower threshold voltage than the n-channel FET of minimum gate length.

FIGS. 19.1 and 19.2 illustrate three-dimensional computer representations for the electrical potential at equilibrium (voltage $V_G$ and $V_D$ both being zero) of locally threshold-adjusted 2-μm/0.5-μm n-channel FET 60 and the globally threshold-adjusted 2-μm n-channel reference FET. The potential in threshold channel portion 66 of 2-μm/0.5-μm n-channel FET 60 reaches the same low value as the potential in channel zone 13 of the 2-μm n-channel reference FET. As a result, threshold channel portion 66 prevents current from moving between the source and drain zones of 2-μm/0.5-μm FET 60.

As a comparison of FIG. 19.1 to FIG. 19.2 shows, the potential in main channel portion 65 of 2-μm/0.5-μm n-channel FET 60 is considerably greater than the potential in channel 13 of the 2-μm n-channel reference FET. Main channel portion 65 is closer to conduction than channel 13. When gate voltage $V_G$ exceeds $V_T$, 2-μm/0.5-μm n-channel FET 60 thus has a lower linear-region on-resistance than the 2-μm n-channel reference FET. As discussed further below, the reduced on-resistance enables locally threshold-adjusted 2-μm/0.5-μm FET 60 to switch better than the globally threshold-adjusted 2-μm n-channel reference FET.

FIGS. 20.1 and 20.2 each illustrate the turn-on/turn-off characteristics at a drain voltage of 5 V for 2-μm/0.5-μm n-channel FET 60 and the 2-μm n-channel reference FET. In FIG. 20.1, drain current $I_D$ is plotted linearly as a function of gate voltage $V_G$. Current $I_D$ is plotted logarithmically as a function of gate voltage $V_G$ in FIG. 20.2. As FIGS. 20.1 and 20.2 (collectively "FIG. 20") show, drain current $I_D$ increases more rapidly with increasing gate voltage $V_G$ in weak and moderate inversion for 2-μm/0.5-μm n-channel FET 60 than for the 2-μm n-channel reference FET. That is, locally threshold-adjusted 2-μm/0.5-μm FET 60 has a lower linear-range on-resistance and, consequently, a greater turn-on steepness than the globally threshold-adjusted otherwise comparable reference FET. This enables 2-μm/0.5-μm FET 60 to switch to full conduction faster more abruptly.

The turn-off characteristics merely involve decreasing gate voltage $V_G$. Accordingly, 2-μm/0.5-μm n-channel FET 60 also has greater turn-off steepness than the long n-channel reference FET, thereby enabling 2-μm/0.5-μm FET 60 to switch off more abruptly than the otherwise comparable reference FET. The improvement in the turn-on/turn-off characteristics of the locally threshold-adjusted n-channel FETs of the invention allows the turn-on/turn-off transients to be reduced. The switching speed increases.

In FIG. 21, the $I_D$-$V_G$ data of FIG. 20 was used to plot the ratio of drain current $I_D$ of 2-μm/0.5-μm n-channel FET 60 to drain current $I_D$ of the 2-μm n-channel reference FET as a function of gate voltage $V_G$. Transconductance gm was also calculated for 2-μm/0.5-μm n-channel FET 60 and the 2-μm n-channel reference FET as a function of gate voltage $V_G$. The $g_M$ data was then combined with the $I_D$ data of FIG. 20 to calculate the ratio of the $g_M$-to-$I_D$ quotient for 2-μm/0.5-μm n-channel FET 60 to the $g_M$-to-$I_D$ quotient for the 2-μm n-channel reference FET. This data is also presented in FIG. 21 as a function of voltage $V_G$.

FIG. 21 shows that 2-μm/0.5-μm n-channel FET 60 provides over twice (going up to four times) as much drain current $I_D$ as the long-gate n-channel reference FET in the weak-to-moderate inversion region from 0.8 V to 1.6 V. On the other hand, the transconductance-to-current quotient ratio is in the vicinity of 0.8 across this weak-to-moderate inversion region. In other words, the locally threshold-adjusted n-channel FET of the invention, as exemplified by 2-μm/0.5-μm FET 60, provides a significant improvement in drain current $I_D$ without significantly degrading the $g_M$-to-$I_D$ quotient. This justifies the use of the local threshold-adjust doping in low-power FETs intended to operate in weak and/or moderate inversion.

FIGS. 22.1 and 22.2 illustrate how drain current $I_D$ varies with drain voltage $V_D$ in weak and moderate inversion at various values of gate voltage $V_G$ ranging from 0.75 V to 1.5 V respectively for 2-μm/0.5-μm n-channel FET 60 and the 2-μm n-channel reference FET. As FIGS. 22.1 and 22.2 illustrate, locally threshold-adjusted 2-μm/0.5-μm FET 60 has a greater drain current than the globally threshold-adjusted 2-μm reference FET at all $V_G$ values in the weak-to-moderate inversion region. The local threshold-adjust doping of the invention thereby provides a substantial improvement in near-threshold operation relative to an otherwise comparable long-gate FET having a global threshold-adjust doping.

In FIG. 22.3, the variation of drain current $I_D$ with drain voltage $V_D$ in weak and moderation inversion across the $V_G$ range of 0.5–1.5 V is illustrated for the globally threshold-adjusted short-gate n-channel reference FET having the minimum manufacturable gate length of approximately 0.7 μm. Simulations yielded a 0.6-V threshold voltage for the short-gate n-channel reference FET. As expected, the short-gate reference FET has greater drain current in weak and moderate inversion than 2-μm/0.5-μm n-channel FET 60. However, the slopes of the $I_D$-VD curves in the saturation region for the short-gate n-channel reference FET are respectively greater than the saturation-region slopes of the $I_D$-VD curves for 2-μm/0.5-μm FET 60. Accordingly, the short-gate n-channel reference FET has lower saturation resistance than 2-μm/0.5-μm FET 60 and cannot achieve as much voltage gain.

Figure 23:
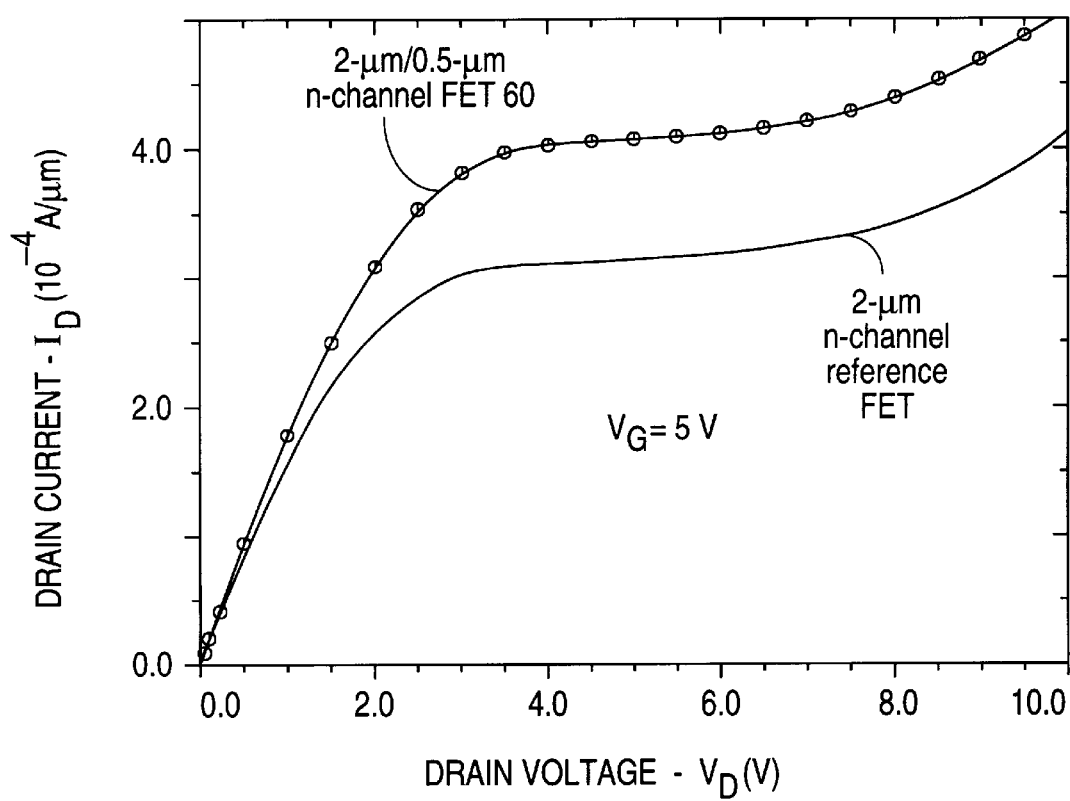
FIG. 23 is a graph of drain current per unit source/drain width as a function of drain voltage for computer simulations of (a) an implementation of the long-gate n-channel FET of FIG. 10 and (b) the reference long-gate n-channel FET.

FIG. 23 illustrates how drain current $I_D$ varies with drain voltage $V_D$ in strong inversion at a gate voltage of 5 V for 2-μm/0.5-μm n-channel FET 60 and the 2-μm n-channel reference FET. In strong inversion, drain current $I_D$ is at a saturation level and only increases slightly with increasing drain voltage $V_D$ below the drain breakdown point. As FIG. 23 shows, 2-μm/0.5-μm FET 60 has considerably better current drive in strong inversion than the otherwise equivalent 2-μm n-channel reference FET. Drain saturation current $I_{Dsat}$ is approximately one third higher than in 2-μm/0.5-μm FET 60.

The $I_{Dsat}$ improvement with the invention can be varied in either direction depending on the percentage of total channel length used for the local threshold-adjust doping and on the doping ratio of the $V_T$ implant to the p-well implant. In particular, an even greater $I_{Dsat}$ improvement than indicated in FIG. 23 can be achieved by decreasing the local threshold-adjust doping level compared to the p-well doping level.

Drain saturation voltage $V_{Dsat}$ is the value of drain voltage $V_D$ at which the channel is pinched off at the drain end due to the application of a suitably high drain voltage in an n-channel FET. Eq. 9, repeated here, is helpful in approximating drain saturation voltage $V_{Dsat}$ for both locally threshold-adjusted 2-μm/0.5-μm n-channel FET 60 and the globally threshold-adjusted 2-μm n-channel reference FET:

$$V_{Dsat} = V_G - V_{FB} - 2\phi_{F_p} - \frac{K_s \epsilon_o q N_B}{C_{ox}^2}\left[\sqrt{1 + \frac{2C_{ox}^2(V_G - V_{FB})}{K_s \epsilon_o q N_B}} - 1\right] \quad (9)$$

In 2-μm/0.5-μm n-channel FET 60, the doping where the channel is pinched off near drain zone 75/76 is the doping of p well (main body region) 61. On the other hand, the doping at the channel pinch-off location in the 2-μm n-channel reference FET is the sum of the global threshold-adjust doping and the p-well doping. For the same p-well doping in 2-μm/0.5-μm FET 60 as in the 2-μm reference FET, application of Eq. 9 leads to the conclusion that 2-μm/0.5-μm FET 60 has a slightly higher drain saturation voltage than the 2-μm reference FET.

On the other hand, the presence of a lower doping level in main body region 61 than in threshold body region 67 relaxes the electric field at the drain end of the channel zone in long n-channel FET 60. Consequently, long-gate FET 60 has a greater drain breakdown voltage than the otherwise comparable globally threshold-adjusted long-gate n-channel reference FET. Although the comparatively reduced doping level in main body region 61 might seem to expose FET 60 to source-to-drain punchthrough, more heavily doped threshold body region 67 along source zone 63/64 acts as a punchthrough shield.

Figure 24:
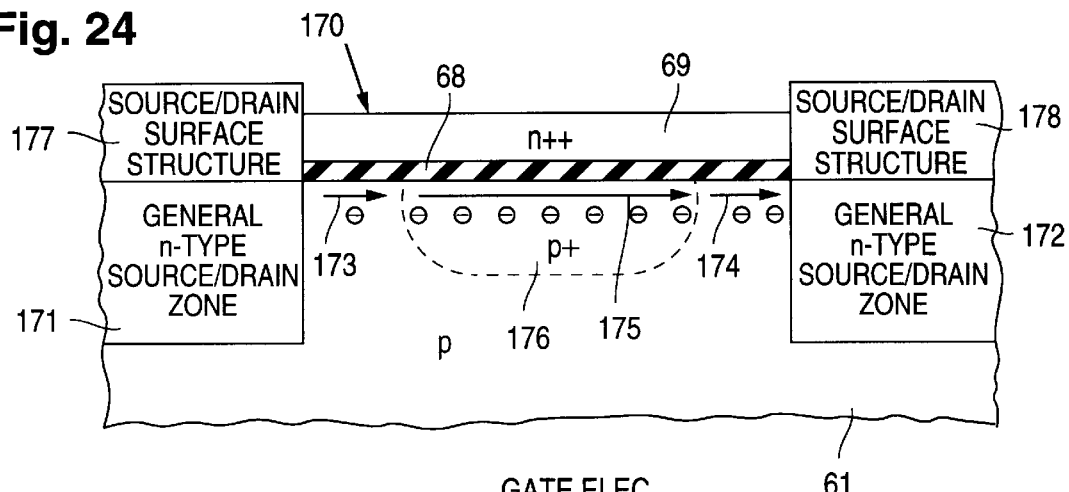
FIGS. 24 and 26 are cross-sectional views of further embodiments of long-gate n-channel insulated-gate FETs that utilize local threshold-adjust dopings to form multi-part channel zones in accordance with the invention.

Turning to FIG. 24, it illustrates another general embodiment of a structure for an enhancement-mode long-gate n-channel insulated-gate FET 170 having a multi-part channel zone in accordance with the invention. Long-gate n-channel FET 170 is suitable for use in NMOS, CMOS, and BiCMOS VLSI circuits. As with FET 60, FET 170 is created from p-type main body (or device) region 61 of the semi-conductive body. Region 61 is again typically a well region in the semiconductive body.

FET 170 has a pair of generalized n-type source/drain zones 171 and 172. A three-part surface channel zone laterally separates source/drain zones 171 and 172 in the semiconductive body. The three-part channel zone is provided with a local threshold-adjust doping in such a way that the channel zone consists of a pair of main channel portions 173 and 174 and a more heavily doped threshold channel portion 175. Main channel portions 173 and 174 are situated in the p-type material of main body (or device) region 61 along the upper semiconductor surface. Threshold channel portion 175, likewise situated along the upper semiconductor surface, is part of a high moderately doped p-type threshold body region 176 formed in p device region 61.

Main channel portion 173 is located between, and laterally adjoins, n-type source/drain zone 171 and threshold channel portion 175. Main channel portion 174 is located between, and laterally adjoins, threshold channel portion 175 and n-type source/drain zone 172. Channel portions 173–175 are thus situated electrically in series between source/drain zones 171 and 172. In contrast to FET 60 where threshold channel portion 66 adjoins source zone 63/64, threshold channel portion 175 in FET 170 is laterally separated from both of source/drain zones 171 and 172.

The remaining components of n-channel FET 170 are silicon-oxide gate dielectric layer 68 and n++ polysilicon gate electrode 69. Gate dielectric layer 68 electrically isolates, and vertically separates, gate electrode 69 from the three-part channel zone. A pair of generalized source/drain surface structures 177 and 178 are situated above source/drain zones 171 and 172 along the source and drain ends of gate electrode 69.

FET 170 is particularly useful in applications where source/drain zone 171 functions as the FET source at certain times and as the FET drain at other times. Source/drain zone 172 functions in a complementary manner to source/drain zone 171. By arranging for threshold channel portion 175 to be equally separated from source/drain zones 171 and 172, FET 170 is fully symmetrical. As is typically needed in applications where each source/drain zone of an FET switches between acting as the source and acting as the drain, changing the direction of current flow through FET 170 does not significantly change its operational characteristics.

Figure 25:
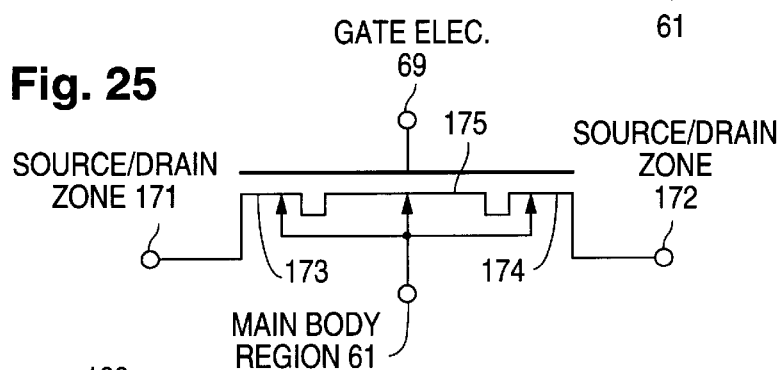
FIGS. 25 and 27 are circuit representations respectively of the n-channel FETs of FIGS. 25 and 27.

A simplified electrical model for n-channel FET 170 is depicted in FIG. 25. FET 170 operates in basically the same manner as FET 60 subject to main channel portions 173 and 174 together performing the function of main channel 65. That is, threshold channel portion 175 controls the threshold and sub-threshold characteristics of FET 170. Main channel portions 173 and 174 determine the current-drive characteristics in normal FET operation.

With FET 170 having a positive threshold voltage, channel portions 173–175 are all off when gate-to-source voltage $V_{GS}$ is well below threshold voltage $V_T$. FET 170 is thus off. Main channel portions 173 and 174 become capable of conduction when voltage $V_{GS}$ is raised to a value near, but still below, $V_T$. Threshold channel portion 175 is, however, still off. Threshold channel portion 175 becomes conductive when voltage $V_{GS}$ is increased to $V_T$. An n channel extending between source/drain zones 171 and 172 is induced in channel portions 173–175. FET 170 turns on. Reducing gate-to-source voltage $V_{GS}$ causes the reverse to occur.

The operating characteristics of long-gate n-channel FET 170 are quite similar to those of long-gate n-channel FET 60. There is one main difference. Because threshold channel portion 175 is laterally separated from both of source/drain zones 171 and 172, the minimum gate length for FET 170 is normally greater than the minimum gate length for FET 60. FET 60 thus provides more current drive than FET 170. However, the ability to use FET 170 in situations requiring source/drain symmetry compensates for the lesser improvement in current drive.

FET 170 can be formed in an LDD configuration just like FET 60. In particular, FET 170 is preferably fabricated according to the process of FIG. 12 subject to modifying photoresist mask 111 in FIG. 12g so that opening 112 is spaced laterally apart from the intended locations for source/drain zones 171 and 172. A long p-channel counterpart to n-channel FET 170 can be provided, likewise in an LDD configuration. For the long p-channel counterpart, opening 115 in photoresist mask 114 of FIG. 12h is modified so as to be laterally separated from intended locations for the p-type source/drain zones. Any of FETs 60, 80, and 170 and the p-channel counterpart to FET 170 can be provided in the wafer along with any of FETs 130 and 150.

Figure 26:
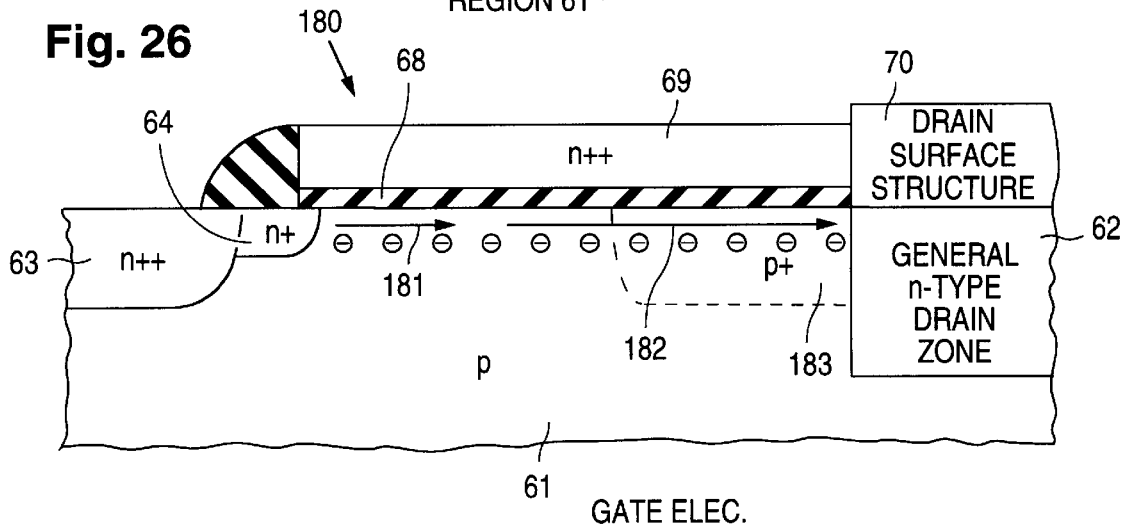

FIG. 26 illustrates a further general embodiment of a structure for an enhancement-mode long-gate n-channel insulated-gate FET 180 having a multi-part channel zone in accordance with the invention. Region/zones 61–64 and 68–71 in long n-channel FET 180 are the same as in FET 60. Drain zone 62 and source zone 63/64 are laterally separated from each other by a two-part surface channel zone in the semiconductive body.

The two-part channel zone is provided with a local threshold-adjust doping in such a manner that the channel zone consists of a main portion 181 and a more heavily doped threshold channel portion 182. Main channel portion 181 is situated in the p-type material of device region 61 and extends between n+ source extension 64 and threshold channel portion 182. In turn, threshold channel portion 182, which is part of a high moderately doped p-type threshold body region 183, extends between main channel portion 181 and n-type drain zone 62. FET 180 is thus configured the same as FET 60 except that threshold channel portion 182 adjoins drain zone 62 rather than source extension 64.

Figure 27:
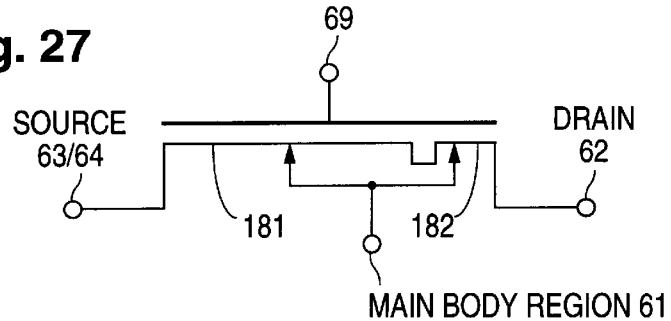

FIG. 27 depicts a simplified electrical model for long n-channel FET 180. With channel portions 181 and 182 situated electrically in series between source zone 63/64 and drain zone 62, FET 180 operates in substantially the same way as FET 60. Threshold channel portion 182 thus determines the threshold and sub-threshold characteristics. Main channel portion 181 controls the current drive characteristics.

The operational characteristics of long n-channel FET 180 are quite similar to those of n-channel FET 60. Although n-channel FET 180 does not achieve the current-drive and drain breakdown voltage improvements of FET 60 or FET 170, the gate length of FET 180 is approximately the same as that of FET 60. The comments made above about n-channel FET 170 in regard to LDD configurations and a long-gate p-channel counterpart apply to FET 180. The process of FIG. 12 can be used to fabricate FET 180 and/or its long-gate p-channel counterpart subject to appropriately changing the location of openings 112 and/or 115 in photoresist masks 111 and/or 112.

While the invention has been described with reference to particular embodiments, this description is solely for the purpose of illustration and is not to be construed as limiting the scope of the invention claimed below. For example, the depth of the source/drain extensions in LDD embodiments of the invention could be greater than the depth of the heavily doped main portions of the source/drain regions. Device regions 61 and 81, as well as device region 151 in FET 150, could be defined by separate photoresist masks rather than using the self-aligned local-oxidation technique described above. The elevation differences between the p device regions and the n device regions could then be eliminated.

A single-well fabrication process could be used in place of the above-described twin-well process. By appropriately increasing the doping of p-type epitaxial layer 82, p-type device region 61 could simply consist of epitaxial layer 82 without introducing any additional p-type dopant into layer 82 to modify the doping level. Alternatively, epitaxial layer 82 could consist of n-type material at a doping level sufficient for n device region 81.

Field-isolation structures such as SWAMI and trench isolation could be used in place of partially recessed field oxide 96. The FETs of the invention could be combined with bipolar transistors for manufacture in a BiCMOS process. Instead of using spacers to define the positions of the main source/drain zones relative to the more lightly doped source/drain extensions, photolithography could be used. The doping steps could be performed in a different order than that described above.

Anti-inversion regions 97 could be created by a procedure in which the anti-inversion field mask is eliminated. After forming field oxide 96, the p-type dopant for both p well 61 and anti-inversion regions 97 could be ion implanted to form well 61 and regions 97, the implant also being performed through field oxide 96. Accordingly, various modifications and applications may be made by those skilled in the art without departing from the true scope and spirit of the invention as defined in the appended claims.

I claim:

1. A method of fabricating multiple field-effect transistors from a semiconductive body having material of a first conductivity type, the method comprising the steps of:
   introducing semiconductor dopant of the first conductivity type simultaneously (a) into part of a first channel zone of the material of the first conductivity type situated outside a main channel portion of the first channel zone to define a threshold channel portion more heavily doped than the main channel portion and (b) into substantially all of a second channel zone of the material of the first conductivity type spaced laterally apart from the first channel zone;
   subsequently providing first and second gate electrodes respectively above, and insulatingly spaced apart from, the first and second channel zones; and
   introducing semiconductor dopant of a second conductivity type opposite to the first conductive type (a) into a pair of laterally separated parts of the semiconductive body to define a pair of first source/drain zones of the second conductivity type laterally separated by the first channel zone such that the main and threshold channel portions of the first channel zone are electrically in series and (b) into a pair of laterally separated parts of the semiconductive body spaced laterally apart from the first source/drain zones to define a pair of second source/drain zones of the second conductivity type laterally separated by the second channel zone.

2. A method as in claim 1 wherein the first introducing step comprises selectively implanting ions of the first conductivity type into the first and second channel zones using an implant shield to substantially prevent the ions from entering the main channel portion of the first channel zone.

3. A method as in claim 1 wherein the semiconductive body has an upper surface to which the channel zones extend, part of the threshold channel portion of the first channel zone having a net dopant concentration which is largely constant along the upper surface of the semiconductive body between the first source/drain zones.

4. A method as in claim 1 wherein the first gate electrode is longer than the second gate electrode.

5. A method as in claim 4 wherein the first gate electrode is at least 50% longer than the second gate electrode.

6. A method as in claim 5 wherein a specified minimum feature size characterizes the method, the second gate electrode being of length approximately equal to the minimum feature size.

7. A method as in claim 1 wherein the threshold channel portion is set at such a length that the first channel zone becomes electrically conductive at approximately the same threshold voltage as the second channel zone during transistor operation.

8. A method as in claim 1 wherein the threshold channel portion is set at such a length that the first channel zone becomes electrically conductive at a lower threshold voltage than the second channel zone during transistor operation.

9. A method as in claim 2 wherein the ions of the first conductivity type are implanted to a mean depth which is largely constant along the lateral extent of the threshold channel portion of the first channel zone.

10. A method as in claim 1 wherein the threshold channel portion of the first channel zone is laterally separated from both first source/drain zones.

11. A method as in claim 10 wherein the main channel portion of the first channel zone is situated between the threshold channel portion of the first channel zone and one of the first source/drain zones, an additional main channel portion of the first channel zone being situated between the threshold channel portion of the first channel zone and the other first source/drain zone.

12. A method as in claim 1 wherein the main channel portion of the first channel zone is electrically conductive when the threshold channel portion of the first channel zone becomes electrically conductive during transistor operation.

13. A method as in claim 1 wherein the second introducing step is initiated after initiating the step of providing the gate electrodes.

14. A method as in claim 1 wherein the second introducing step comprises forming at least one of the first source/drain zones as a main source/drain portion and a more lightly doped extension located between the first channel zone and the main source/drain portion.

15. A method of fabricating multiple field-effect transistors from a semiconductive body having material of a first conductivity type, the method comprising the steps of:
   introducing semiconductor dopant of the first conductivity type (a) into part of a first channel zone of the material of the first conductivity type situated outside a main channel portion of the first channel zone to define a threshold channel portion more heavily doped than the main channel portion and (b) into substantially all of a second channel zone of the material of the first conductivity type spaced laterally apart from the first channel zone;
   subsequently providing first and second gate electrodes respectively above, and insulatingly spaced apart from, the first and second channel zones; and
   introducing semiconductor dopant of a second conductivity type opposite to the first conductive type (a) into a pair of laterally separated parts of the semiconductive body to define a pair of first source/drain zones of the second conductivity type laterally separated by the first channel zone such that the main and threshold channel portions of the first channel zone are electrically in series and such that the threshold channel portion more heavily doped than the main channel portion adjoins one of the first source/drain zones and (b) into a pair of laterally separated parts of the semiconductive body spaced laterally apart from the first source/drain zones to define a pair of second source/drain zones of the second conductivity type laterally separated by the second channel zone, the threshold channel portion of the first channel zone being of such length that the first channel zone becomes electrically conductive at a lower threshold voltage than the second channel zone during transistor operation.

16. A method as in claim 15 wherein the first introducing step comprises selectively implanting ions of the first conductivity type into the first and second channel zones using an implant shield to substantially prevent the ions from entering the main channel portion of the first channel zone.

17. A method as in claim 15 wherein the semiconductive body has an upper surface to which the channel zones extend, part of the threshold channel portion of the first channel zone having a net dopant concentration which is largely constant along the upper surface of the semiconductive body between the first source/drain zones.

18. A method as in claim 15 wherein the first gate electrode is longer than the second gate electrode.

19. A method as in claim 18 wherein the first gate electrode is at least 50% longer than the second gate electrode.

20. A method as in claim 19 wherein a specified minimum feature size characterizes the method, the second gate electrode being of length approximately equal to the minimum feature size.

21. A method of fabricating multiple field-effect transistors from a semiconductive body having material of a first conductivity type, the method comprising the steps of:

introducing semiconductor dopant of the first conductivity type (a) into part of a first channel zone of the material of the first conductivity type situated outside a main channel portion of the first channel zone to define a threshold channel portion more heavily doped than the main channel portion and (b) into substantially all of a second channel zone of the material of the first conductivity type spaced laterally apart from the first channel zone;

subsequently providing first and second gate electrodes respectively above, and insulatingly spaced apart from, the first and second channel zones; and introducing semiconductor dopant of a second conductivity type opposite to the first conducive type (a) into a pair of laterally separated parts of the semiconductive body to define a pair of first source/drain zones of the second conductivity type laterally separated by the first channel zone such of the main and threshold channel portions of the first channel zone are electrically in series and such that thereshold channel portion more heavily doped than the main channel portion adjoins one of the first source/drain zones and (b) into a pair of laterally separated parts of the semniconductive body spaced laterally apart from the first source/drain zones to define a pair of second source/drain zones of the second conductivity type laterally separated by the second channel zone, the first gate electrode being at least 50% longer than the second gate electrode, a specified minimum feature size characterizing the method, the second gate electrode being of length approximately equal to the minimum feature size.

22. A method as in claim 21 wherein the first introducing step comprises selectively implanting ions of the first conductivity type into the first and second channel zones using an implant shield to substantially prevent the ions from entering the main channel portion of the first channel zone.

23. A method as in claim 21 wherein the semiconductive body has an upper surface to which the channel zones extend, part of the threshold channel portion of the first channel zone having a net dopant concentration which is largely constant along the upper surface of the semiconductive body between the first source/drain zones.

24. A method as in claim 21 wherein the threshold channel portion is set at such a length that the first channel zone becomes electrically conductive at approximately the same threshold voltage as the second channel zone during transistor operation.

25. A method of fabricating multiple field-effect transistors from a semiconductive body having material of a first conductivity type, the method comprising the steps of:

introducing semiconductor dopant of the first conductivity type (a) into part of a first channel zone of the material of the first conductivity type situated outside a main channel portion of the first channel zone to define a threshold channel portion more heavily doped than the main channel portion and (b) into substantially all of a second channel zone of the material of the first conductivity type spaced laterally apart from the first channel zone;

subsequently providing first and second gate electrodes respectively above, and insulatingly spaced apart from, the first and second channel zones; and introducing semiconductor dopant of a second conductivity type opposite to the first conductive type (a) into a pair of laterally separated parts of the semiconductive body to define a pair of first source/drain zones of the second conductivity type laterally separated by the first channel zone such that the main and threshold channel portions of the first channel zone are electrically in series and such that the threshold channel portion more heavily doped than the main channel portion adjoins one of the first source/drain zones and (b) into a pair of laterally separated parts of the semiconductive body spaced laterally apart from the first source/drain zones to define a pair of second source/drain zones of the second conductivity type laterally separated by the second channel zone, the first gate electrode being at least 50% longer than the second gate electrode, the threshold channel portion of the first channel zone being set at such a length that the first channel zone becomes electrically conductive at approximately the same threshold voltage as the second channel zone during transistor operation.

26. A method as in claim 25 wherein the first introducing step comprises selectively implanting ions of the first conductivity type into the first and second channel zones using an implant shield to substantially prevent the ions from entering the main channel portion of the first channel zone.

27. A method as in claim 25 wherein the semiconductive body has an upper surface to which the channel zones extend, part of the threshold channel portion of the first channel zone having a net dopant concentration which is largely constant along the upper surface of the semiconductive body between the first source/drain zones.

28. A method as in claim 25 wherein a specified minimum feature size characterizes the method, the second gate electrode being of length approximately equal to the minimum feature size.

* * * * *